United States Patent
Huang et al.

(10) Patent No.: US 12,236,890 B2
(45) Date of Patent: Feb. 25, 2025

(54) SHIFT REGISTER, DRIVING METHOD THEREOF, DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Juntao Chen, Beijing (CN); Juan Fang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/033,365

(22) PCT Filed: May 27, 2022

(86) PCT No.: PCT/CN2022/095644
§ 371 (c)(1),
(2) Date: Apr. 24, 2023

(87) PCT Pub. No.: WO2023/226010
PCT Pub. Date: Nov. 30, 2023

(65) Prior Publication Data
US 2024/0379061 A1    Nov. 14, 2024

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2310/0286* (2013.01); *G09G 2330/021* (2013.01)

(58) Field of Classification Search
CPC ......... G09G 3/3266; G09G 2310/0286; G09G 2330/021; G11C 19/28
See application file for complete search history.

(56) References Cited

U.S. PATENT DOCUMENTS

| 2016/0275845 A1 | 9/2016 | Tsai et al. |
| 2017/0116926 A1 | 4/2017 | Bong et al. |
| (Continued) | | |

FOREIGN PATENT DOCUMENTS

| CN | 104134430 A | 11/2014 |
| CN | 205354618 U | 6/2016 |
| (Continued) | | |

*Primary Examiner* — Muhammad N Edun
(74) *Attorney, Agent, or Firm* — Ling Wu; Stephen Yang; Ling and Yang Intellectual Property

(57) ABSTRACT

A shift register includes a first control sub-circuit, a second control sub-circuit, a pull-up control sub-circuit and an output control sub-circuit, wherein the first control sub-circuit is configured to provide a signal of a third power supply terminal or a clock signal terminal to a first node and a third node under the control of a signal input terminal, the clock signal terminal and a second node; the pull-up control sub-circuit is configured to provide a signal of a second power supply terminal to the first node under the control of the third node; the second control sub-circuit is configured to provide a signal of the signal input terminal to the second node and a fourth node under the control of the clock signal terminal and the first power supply terminal.

20 Claims, 12 Drawing Sheets

(56) References Cited

U.S. PATENT DOCUMENTS

| | | | |
|---|---|---|---|
| 2018/0114482 A1 | 4/2018 | Jung | |
| 2021/0225252 A1* | 7/2021 | Xue | G09G 3/20 |
| 2021/0366351 A1* | 11/2021 | Mi | G11C 19/28 |
| 2022/0366848 A1* | 11/2022 | Huang | G09G 3/3266 |

FOREIGN PATENT DOCUMENTS

| | | |
|---|---|---|
| CN | 106991945 A | 7/2017 |
| CN | 107978270 A | 5/2018 |
| CN | 110415636 A | 11/2019 |
| CN | 113889022 A | 1/2022 |
| CN | 114038378 A | 2/2022 |
| KR | 1020190118404 A | 10/2019 |

\* cited by examiner

SHIFT REGISTER, DRIVING METHOD THEREOF, DISPLAY SUBSTRATE AND DISPLAY DEVICE

CROSS-REFERENCE TO RELATED APPLICATION

This application is a national stage application of PCT Application No. PCT/CN2022/095644, which is filed on May 27, 2022, and entitled "Shift Register, Driving Method Thereof, Display Substrate and Display Device", the content of which should be regarded as being incorporated herein by reference.

TECHNICAL FIELD

The present disclosure relates to, but is not limited to, the field of display technology, and more particularly, to a shift register, a driving method thereof, a display substrate and a display device.

BACKGROUND

Organic light emitting diodes (OLEDs) and quantum-dot light emitting diodes (QLEDs), which are active light emitting display elements, have advantages such as self-luminescence, wide viewing angle, high contrast, low power consumption, extremely high response speed, lightness and thinness, bendability, low cost, etc. With the continuous development of display technology, display devices that use OLEDs or QLEDs as light emitting elements and use thin film transistors (TFTs) for signal control have become mainstream products in the field of display at present.

SUMMARY

The following is a summary of subject matters described in the present disclosure in detail. The summary is not intended to limit the protection scope of the claims.

In a first aspect, the present disclosure provides a shift register including a first control sub-circuit, a second control sub-circuit, a pull-up control sub-circuit and an output control sub-circuit, wherein the shift register is electrically connected to a signal input terminal, a signal output terminal, a clock signal terminal and a first power supply terminal through a third power supply terminal;

the first control sub-circuit, electrically connected to the signal input terminal, the clock signal terminal, the third power supply terminal, a first node, a second node and a third node respectively, is configured to provide a signal of the third power supply terminal or the clock signal terminal to the first node and the third node under the control of the signal input terminal, the clock signal terminal and the second node;

the pull-up control sub-circuit, electrically connected to the second power supply terminal, the first node and the third node respectively, is configured to provide a signal of the second power supply terminal to the first node under the control of the third node;

the second control sub-circuit, electrically connected to the clock signal terminal, the signal input terminal, the first power supply terminal, the second node and a fourth node respectively, is configured to provide a signal of the signal input terminal to the second node and the fourth node under the control of the clock signal terminal and the first power supply terminal; and the output control sub-circuit, electrically connected to the signal output terminal, the first power supply terminal, the third power supply terminal, the first node and the fourth node respectively, is configured to provide a signal of the first power supply terminal or the signal of the third power supply terminal to the signal output terminal under the control of the first node and the fourth node.

In some possible implementations, the first power supply terminal and the second power supply terminal are the same signal terminal; and a voltage value of the signal of the first power supply terminal and a voltage value of the signal of the second power supply terminal are greater than a voltage value of the signal of the third power supply terminal.

In some possible implementations, the first control sub-circuit includes a first transistor, a second transistor, a fourth transistor and a first capacitor, the first capacitor including a first plate and a second plate;

a control electrode of the first transistor is electrically connected to the third node, a first electrode of the first transistor is electrically connected to the clock signal terminal, and a second electrode of the first transistor is electrically connected to the first node;

a control electrode of the second transistor is electrically connected to the signal input terminal, a first electrode of the second transistor is electrically connected to the third power supply terminal, and a second electrode of the second transistor is electrically connected to the third node;

a control electrode of the fourth transistor is electrically connected to the second node, a first electrode of the fourth transistor is electrically connected to the third power supply terminal, and a second electrode of the fourth transistor is electrically connected to the first node; and the first plate of the first capacitor is electrically connected to the clock signal terminal, and the second plate of the first capacitor is electrically connected to the third node.

In some possible implementations, the pull-up control sub-circuit includes a third transistor; and a control electrode of the third transistor is electrically connected to the third node, a first electrode of the third transistor is electrically connected to the second power supply terminal, and a second electrode of the third transistor is electrically connected to the first node.

In some possible implementations, the second control sub-circuit includes a fifth transistor and a sixth transistor;

a control electrode of the fifth transistor is electrically connected to the clock signal terminal, a first electrode of the fifth transistor is electrically connected to the signal input terminal, and a second electrode of the fifth transistor is electrically connected to the second node; and a control electrode of the sixth transistor is electrically connected to the first power supply terminal, a first electrode of the sixth transistor is electrically connected to the second node, and a second electrode of the sixth transistor is electrically connected to the fourth node.

In some possible implementations, the output control sub-circuit includes a seventh transistor, an eighth transistor, a ninth transistor, a tenth transistor, a second capacitor and a third capacitor, the second capacitor and the third capacitor each including a first plate and a second plate;

a control electrode of the seventh transistor is electrically connected to the first node, a first electrode of the seventh transistor is electrically connected to the third power supply terminal, and a second electrode of the seventh transistor is electrically connected to the signal output terminal;

a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode of the ninth transistor is electrically connected to the first node, a first electrode of the ninth transistor is electrically connected to the third power supply terminal, and a second electrode of the ninth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the second capacitor is electrically connected to the first node, and the second plate of the second capacitor is electrically connected to the third power supply terminal; and the first plate of the third capacitor is electrically connected to the fourth node, and the second plate of the third capacitor is electrically connected to the signal output terminal.

In some possible implementations, the output control sub-circuit includes a seventh transistor, an eighth transistor, a tenth transistor, a second capacitor and a third capacitor, the second capacitor and the third capacitor each including a first plate and a second plate;

a control electrode of the seventh transistor is electrically connected to the first node, a first electrode of the seventh transistor is electrically connected to the third power supply terminal, and a second electrode of the seventh transistor is electrically connected to the signal output terminal;

a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the second capacitor is electrically connected to the first node, and the second plater of the second capacitor is electrically connected to the third power supply terminal; and the first plate of the third capacitor is electrically connected to the fourth node, and the second plate of the third capacitor is electrically connected to the signal output terminal.

In some possible implementations, the first control sub-circuit includes a first transistor, a second transistor, a fourth transistor and a first capacitor, the second control sub-circuit includes a fifth transistor and a sixth transistor, the pull-up control sub-circuit includes a third transistor, and the output control sub-circuit includes a seventh transistor, an eighth transistor, a ninth transistor, a tenth transistor, a second capacitor and a third capacitor, the first capacitor through the third capacitor each including a first plate and a second plate, a control electrode of the first transistor is electrically connected to the third node, a first electrode of the first transistor is electrically connected to the clock signal terminal, and a second electrode of the first transistor is electrically connected to the first node;

a control electrode of the second transistor is electrically connected to the signal input terminal, a first electrode of the second transistor is electrically connected to the third power supply terminal, and a second electrode of the second transistor is electrically connected to the third node;

a control electrode of the third transistor is electrically connected to the third node, a first electrode of the third transistor is electrically connected to the second power supply terminal, and a second electrode of the third transistor is electrically connected to the first node;

a control electrode of the fourth transistor is electrically connected to the second node, a first electrode of the fourth transistor is electrically connected to the third power supply terminal, and a second electrode of the fourth transistor is electrically connected to the first node;

a control electrode of the fifth transistor is electrically connected to the clock signal terminal, a first electrode of the fifth transistor is electrically connected to the signal input terminal, and a second electrode of the fifth transistor is electrically connected to the second node;

a control electrode of the sixth transistor is electrically connected to the first power supply terminal, a first electrode of the sixth transistor is electrically connected to the second node, and a second electrode of the sixth transistor is electrically connected to the fourth node;

a control electrode of the seventh transistor is electrically connected to the first node, a first electrode of the seventh transistor is electrically connected to the third power supply terminal, and a second electrode of the seventh transistor is electrically connected to the signal output terminal;

a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode of the ninth transistor is electrically connected to the first node, a first electrode of the ninth transistor is electrically connected to the third power supply terminal, and a second electrode of the ninth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the first capacitor is electrically connected to the clock signal terminal, and the second plate of the first capacitor is electrically connected to the third node;

the first plate of the second capacitor is electrically connected to the first node, and the second plate of the second capacitor is electrically connected to the third power supply terminal;

the first plate of the third capacitor is electrically connected to the fourth node, and the second plate of the third capacitor is electrically connected to the signal output terminal; and the first transistor through the tenth transistor are oxide transistors and are of N-type.

In some possible implementations, the first control sub-circuit includes a first transistor, a second transistor, a fourth transistor and a first capacitor, the second control sub-circuit includes a fifth transistor and a sixth transistor, the pull-up control sub-circuit includes a third transistor, and the output control sub-circuit includes a seventh transistor, an eighth transistor, a tenth transistor, a second capacitor and a third capacitor, the first capacitor through the third capacitor each including a first plate and a second plate, a control electrode of the first transistor is electrically connected to the third node, a first electrode of the first transistor is electrically connected to the clock signal terminal, and a second electrode of the first transistor is electrically connected to the first node;

a control electrode of the second transistor is electrically connected to the signal input terminal, a first electrode of the second transistor is electrically connected to the third power supply terminal, and a second electrode of the second transistor is electrically connected to the third node;

a control electrode of the third transistor is electrically connected to the third node, a first electrode of the third transistor is electrically connected to the second power supply terminal, and a second electrode of the third transistor is electrically connected to the first node;

a control electrode of the fourth transistor is electrically connected to the second node, a first electrode of the fourth transistor is electrically connected to the third power supply terminal, and a second electrode of the fourth transistor is electrically connected to the first node;

a control electrode of the fifth transistor is electrically connected to the clock signal terminal, a first electrode of the fifth transistor is electrically connected to the signal input terminal, and a second electrode of the fifth transistor is electrically connected to the second node;

a control electrode of the sixth transistor is electrically connected to the first power supply terminal, a first electrode of the sixth transistor is electrically connected to the second node, and a second electrode of the sixth transistor is electrically connected to the fourth node;

a control electrode of the seventh transistor is electrically connected to the first node, a first electrode of the seventh transistor is electrically connected to the third power supply terminal, and a second electrode of the seventh transistor is electrically connected to the signal output terminal;

a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the first capacitor is electrically connected to the clock signal terminal, and the second plate of the first capacitor is electrically connected to the third node;

the first plate of the second capacitor is electrically connected to the first node, and the second plate of the second capacitor is electrically connected to the third power supply terminal;

the first plate of the third capacitor is electrically connected to the fourth node, and the second plate of the third capacitor is electrically connected to the signal output terminal; and the first transistor through the eighth transistor and the tenth transistor are oxide transistors and are of N-type.

In a second aspect, the present disclosure further provides a display substrate including a substratum and a circuit structure layer disposed on the substratum, wherein the circuit structure layer includes a gate driving circuit, which includes a plurality of cascaded shift registers;

a signal output terminal of an i-th stage shift register is electrically connected to a signal input terminal of an (i+1)-th stage shift register, 1≤i≤M−1 and M being the total number of stages of the shift registers;

each of the shift registers includes a first control sub-circuit, a second control sub-circuit, a pull-up control sub-circuit and an output control sub-circuit;

the first control sub-circuit, electrically connected to a signal input terminal, a clock signal terminal, a third power supply terminal, a first node, a second node and a third node respectively, is configured to provide a signal of the third power supply terminal or the clock signal terminal to the first node and the third node under the control of the signal input terminal, the clock signal terminal and the second node;

the pull-up control sub-circuit, electrically connected to a second power supply terminal, the first node and the third node respectively, is configured to provide a signal of the second power supply terminal to the first node under the control of the third node;

the second control sub-circuit, electrically connected to the clock signal terminal, the signal input terminal, a first power supply terminal, the second node and a fourth node respectively, is configured to provide a signal of the signal input terminal to the second node and the fourth node under the control of the clock signal terminal and the first power supply terminal; and the output control sub-circuit, electrically connected to the signal output terminal, the first power supply terminal, the third power supply terminal, the first node and the fourth node respectively, is configured to provide a signal of the first power supply terminal or the signal of the third power supply terminal to the signal output terminal under the control of the first node and the fourth node.

In some possible implementations, the display substrate further includes an initial signal line, a first clock signal line, a second clock signal line, a first power supply line and a second power supply line extending along a first direction, the initial signal line, the first clock signal line, the second clock signal line, the first power supply line and the second power supply line being arranged along a second direction, and the first direction intersecting the second direction; and a signal input terminal of a first stage shift register is electrically connected to the initial signal line, first power supply terminals and second power supply terminals of all the shift registers are electrically connected to the first power supply line, third power supply terminals of all the shift registers are electrically connected to the second power supply line, a clock signal terminal of the i-th stage shift register is electrically connected to one of the first clock signal line and the second clock signal line, and a clock signal terminal of the (i+1)-th stage shift register is electrically connected to the other one of the first clock signal line and the second clock signal line.

In some possible implementations, the circuit structure layer includes a semiconductor layer, a first insulating layer, a first conductive layer, a second insulating layer, a second conductive layer, a third insulating layer and a third conductive layer which are sequentially stacked on the substratum, wherein the semiconductor layer includes active layers of all transistors located in the gate driving circuit;

the first conductive layer includes control electrodes of all the transistors and a first plate of a first capacitor through a first plate of a third capacitor, which are located in the gate driving circuit;

the second conductive layer includes a second plate of the first capacitor through a second plate of the third capacitor, which are located in the gate driving circuit; and the third conductive layer includes the initial signal line, the first clock signal line, the second clock signal line, the first power supply line, the second power supply line and first and second electrodes of all the transistors located in the gate driving circuit.

In some possible implementations, the shift register includes a first through eighth transistor and a tenth transistor, the third transistor being located between the first capacitor and the fourth transistor;

a virtual straight line extending along the second direction passes through the active layer of the third transistor and the first plate of the first capacitor; and a virtual straight line extending along the second direction passes through the first plate of the first capacitor, the control electrode of the third transistor and the control electrode of the fourth transistor.

In some possible implementations, the semiconductor layer further includes an active connection line configured to connect the active layer of the second transistor with the active layer of the fourth transistor; and an orthographic projection of the second electrode of the first transistor on the substratum overlaps at least partially with an orthographic projection of the active connection line on the substratum.

In some possible implementations, the first conductive layer further includes a first connection line and a second connection line; and the control electrode of the first transistor, the control electrode of the third transistor and the first connection line form an integrated structure, and the control electrode of the first transistor and the control electrode of the third transistor are located at both sides of the first connection line respectively, the first plate of the first capacitor, the control electrode of the fifth transistor and the second connection line form an integrated structure, and the control electrode of the fifth transistor and the second connection line are located at the same side of the first plate of the first capacitor.

In some possible implementations, an orthographic projection of the first electrode of the first transistor on the substratum overlaps at least partially with an orthographic projection of the second connection line on the substratum; and an orthographic projection of the second electrode of the first transistor on the substratum overlaps at least partially with an orthographic projection of the first connection line on the substratum.

In some possible implementations, the second plate of the first capacitor includes a first capacitor body part and a first capacitor connection part connected to each other, the first capacitor connection part being located at one side of the first capacitor body part close to the second plate of the second capacitor;

an orthographic projection of the first capacitor body part on the substratum overlaps at least partially with an orthographic projection of the first plate of the first capacitor on the substratum, and there is no overlapping area between an orthographic projection of the first capacitor connection part on the substratum and the orthographic projection of the first plate of the first capacitor on the substratum;

the second plate of the third capacitor includes a third capacitor body part and a third capacitor connection part connected to each other, the third capacitor connection part being located at one side of the third capacitor body part close to the second plate of the first capacitor; and an orthographic projection of the third capacitor body part on the substratum overlaps at least partially with an orthographic projection of the first plate of the third capacitor on the substratum, and there is no overlapping area between an orthographic projection of the third capacitor connection part on the substratum and the orthographic projection of the first plate of the third capacitor on the substratum.

In some possible implementations, the initial signal line is located at one side of the first capacitor away from the second capacitor, the first clock signal line is located at one side of the initial signal line close to the first capacitor, the second clock signal line is located at one side of the first clock signal line close to the first capacitor, the first power supply line is located at one side of the second clock signal line close to the first capacitor, and the second power supply line is located at one side of the seventh transistor away from the first capacitor.

In some possible implementations, the third conductive layer further includes a third connection line; and an orthographic projection of the third connection line on the substratum overlaps at least partially with orthographic projections of the first capacitor connection part and the control electrode of the third transistor on the substratum, and the third connection line is electrically connected to the control electrode of the third transistor and the first capacitor connection part.

In some possible implementations, an orthographic projection of the first electrode of the fifth transistor on the substratum overlaps partially with an orthographic projection of the third capacitor connection part of the shift register at the previous stage on the substratum, and the first electrode of the fifth transistor is electrically connected to the third capacitor connection part of the shift register at the previous stage.

In some possible implementations, the orthographic projection of the third capacitor connection part on the substratum overlaps at least partially with an orthographic projection of the first electrode of the tenth transistor on the substratum; and the orthographic projection of the third capacitor body part on the substratum overlaps at least partially with orthographic projections of the second electrode of the eighth transistor and the second electrode of the tenth transistor on the substratum, and the third capacitor body part is electrically connected to the second electrode of the eighth transistor and the second electrode of the tenth transistor, respectively.

In some possible implementations, an orthographic projection of the first power supply line on the substratum overlaps at least partially with orthographic projections of the control electrode of the fifth transistor and the control electrode of the sixth transistor on the substratum; and an orthographic projection of the second power supply line on the substratum overlaps at least partially with an orthographic projection of the second plate of the second capacitor on the substratum.

In a third aspect, the present disclosure further provides a display device including the display substrate described above.

In a fourth aspect, the present disclosure further provides a driving method of a shift register, which is used for driving the shift register described above. The method includes:

a first control sub-circuit providing a signal of a third power supply terminal or a clock signal terminal to a first node and a third node under the control of a signal input terminal, the clock signal terminal and a second node;

a pull-up control sub-circuit providing a signal of a second power supply terminal to the first node under the control of the third node;

a second control sub-circuit providing a signal of the signal input terminal to the second node and a fourth node under the control of the clock signal terminal and a first power supply terminal; and the output control sub-circuit providing a signal of the first power supply terminal or the signal of the third power supply terminal to the signal output terminal under the control of the first node and the fourth node.

Other aspects may become clear after the accompanying drawings and the detailed description are read and understood.

BRIEF DESCRIPTION OF DRAWINGS

The accompanying drawings are intended to provide an understanding of technical schemes of the present disclosure and form a part of the specification, and are used to explain the technical schemes of the present application together with examples of the present application, and not intended to form limitations to the technical schemes of the present disclosure.

DETAILED DESCRIPTION

Figure 1:
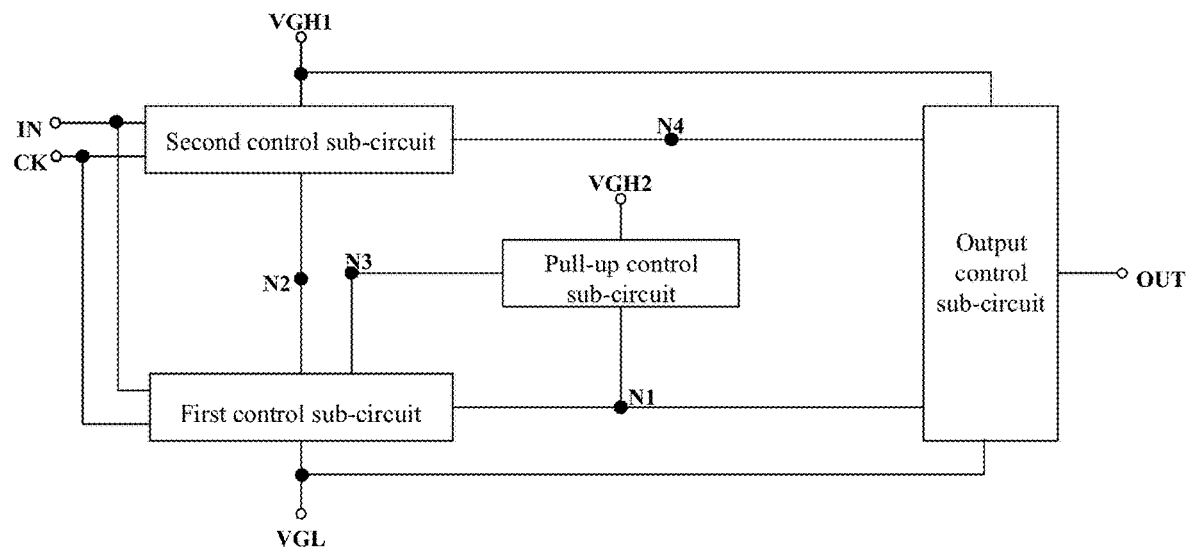
FIG. 1 is a schematic structural diagram of a shift register in accordance with an example of the present disclosure.

In order to make objects, technical schemes and advantages of the present disclosure more clear, examples of the present disclosure will be described below in detail in combination with the drawings. It should be noted that embodiments may be implemented in a number of different forms. Those of ordinary skills in the art may readily understand the fact that implementations and contents may be transformed into various forms without departing from the purpose and scope of the present disclosure. Therefore, the present disclosure should not be interpreted as being limited to the contents recorded in following embodiments only. The examples in the present disclosure and features in the examples can be arbitrarily combined with each other without conflicts. In order to keep the following description of the examples of the present disclosure clear and concise, detailed descriptions of a portion of known functions and known components are omitted in the present disclosure. The drawings in the examples of the present disclosure relate only to the structures involved in the examples of the present disclosure, and other structures may be described with reference to conventional designs.

Scales of the drawings in the present disclosure can be used as references in the actual processes, but are not limited thereto. For example, the width-to-length ratio of a channel, the thickness of each film layer and the spacing between two film layers, and the width of each signal line and the spacing between two signal lines can be adjusted according to actual needs. The number of pixels in a display substrate and the number of sub-pixels in each pixel are not limited to the number shown in the drawings. The drawings described in the present disclosure is a schematic structure diagram only, and one implementation of the present disclosure is not limited to the shapes or numerical values shown in the drawings.

Ordinal numerals such as "first", "second", "third" and the like in the specification are set in order to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or position relationships are used in the specification to illustrate position relationships between the constituent elements with reference to the drawings, and are intended to facilitate description of the specification and simplification of the description, but not to indicate or imply that the mentioned device or element must have a specific orientation or be constructed and operated in a specific orientation, therefore, they should not be understood as limitations to the present disclosure. The position relationships between the constituent elements are appropriately changed according to directions of the constituent elements described. Therefore, words and phrases used in the specification are not limited and appropriate substitutions may be made according to situations.

Unless otherwise specified and defined explicitly, the terms "installed", "coupled" and "connected" should be understood in a broad sense in the specification. For example, the connection may be a fixed connection, a detachable connection or an integrated connection, or may be a mechanical connection or an electrical connection, or may be a direct connection, an indirect connection through intermediate components, or communication inside two components. The specific meanings of the above terms in the present disclosure can be understood by a person of ordinary skill in the art according to the specific situations.

In the specification, a transistor refers to a component which at least includes three terminals, a gate electrode, a drain electrode and a source electrode. The transistor has a channel region between the drain electrode (drain electrode terminal, drain region or drain) and the source electrode (source electrode terminal, source region or source), and a current can flow through the drain electrode, the channel region and the source electrode. In the specification, the channel region refers to a region which the current flows mainly through.

In the specification, the first electrode may be a drain electrode and the second electrode may be a source electrode, or the first electrode may be a source electrode and the second electrode may be a drain electrode. In the case that transistors with opposite polarities are used or the case that a current direction is changed during circuit operation, functions of the "source electrode" and the "drain electrode" are sometimes interchanged. Therefore, the "source electrode" and the "drain electrode" can be interchanged in the specification.

In the specification, "electrical connection" includes a case where the constituent elements are connected together through an element with a certain electrical effect. The "element with the certain electrical effect" is not particularly limited as long as electrical signals can be sent and received between the connected constituent elements. Examples of the "element with the certain electrical action" not only include an electrode and a wiring, but also include a switching element such as a transistor, a resistor, an inductor, a capacitor, other elements with one or more functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 800 and less than 100°, and thus also includes a state in which the angle is greater than 850 and less than 95°.

In the specification, "film" and "layer" may be interchangeable. For example, sometimes "conductive layer" may be replaced by "conductive film". Similarly, sometimes "insulating film" may be replaced by "insulating layer".

"Being disposed on the same layer" mentioned in the specification means that two (or more than two) structures are formed by patterning through the same running of patterning processes, and they may be made of the same or different materials. For example, materials of the precursors forming a plurality of structures disposed on the same layer are the same, and the resulting materials may be the same or different.

Triangle, rectangle, trapezoid, pentagon and hexagon in the specification are not in the strict sense, and they may be approximate triangle, rectangle, trapezoid, pentagon or hexagon, in which there may be some small deformation caused by tolerance, or there may be chamfers, arc edges and deformation, etc.

"About" in the present disclosure means that a boundary is defined loosely and numerical values in process and measurement error ranges are allowed.

A display substrate includes a pixel circuit, a light emitting element and a gate driving circuit, wherein the gate driving circuit is configured to provide a gate signal to the pixel circuit so that the pixel circuit can drive the light emitting element to emit light. The driving ability of gate driving circuit is weak such that the display requirements cannot be met.

FIG. 1 is a schematic structural diagram of a shift register in accordance with an example of the present disclosure. As shown in FIG. 1, the shift register in accordance with the example of the present disclosure may include a first control sub-circuit, a second control sub-circuit, a pull-up control sub-circuit and an output control sub-circuit. The shift register is electrically connected to a signal input terminal IN, a signal output terminal OUT, a clock signal terminal CK and a first power supply terminal VGH1 through a third power supply terminal VGL.

The first control sub-circuit, electrically connected to the signal input terminal IN, the clock signal terminal CK, the third power supply terminal VGL, a first node N1, a second node N2 and a third node N3 respectively, is configured to provide a signal of the third power supply terminal VGL or the clock signal terminal CK to the first node N1 and the third node N3 under the control of the signal input terminal IN, the clock signal terminal CK and the second node N2; the pull-up control sub-circuit, electrically connected to the second power supply terminal VGH2, the first node N1 and the third node N3 respectively, is configured to provide a signal of the second power supply terminal VGH2 to the first node N1 under the control of the third node N3; the second control sub-circuit, electrically connected to the clock signal terminal CK, the signal input terminal IN, the first power supply terminal VGH1, the second node N2 and a fourth node N4 respectively, is configured to provide a signal of the signal input terminal IN to the second node N2 and the fourth node N4 under the control of the clock signal terminal CK and the first power supply terminal VGH1; the output control sub-circuit, electrically connected to the signal output terminal OUT, the first power supply terminal VGH1, the third power supply terminal VGL, the first node N1 and the fourth node N4 respectively, is configured to provide a signal of the first power supply terminal VGH1 or the signal of the third power supply terminal VGL to the signal output terminal OUT under the control of the first node N1 and the fourth node N4.

In an exemplary example, the first power supply terminal VGH1 and the second power supply terminal VGH2 continuously provides high-level signals, and the third power supply terminal VGL continuously provides low-level signals.

In an exemplary example, a signal of the clock signal terminal CK may be a periodic pulse signal.

The shift register in accordance with the example of the present disclosure includes a first control sub-circuit, a second control sub-circuit, a pull-up control sub-circuit and an output control sub-circuit, wherein the shift register is electrically connected to a signal input terminal, a signal output terminal, a clock signal terminal and a first power supply terminal through a third power supply terminal; the first control sub-circuit, electrically connected to the signal input terminal, the clock signal terminal, the third power supply terminal, a first node, a second node and a third node respectively, is configured to provide a signal of the third power supply terminal or the clock signal terminal to the first node and the third node under the control of the signal input terminal, the clock signal terminal and the second node; the pull-up control sub-circuit, electrically connected to the second power supply terminal, the first node and the third node respectively, is configured to provide a signal of the second power supply terminal to the first node under the control of the third node; the second control sub-circuit, electrically connected to the clock signal terminal, the signal input terminal, the first power supply terminal, the second node and a fourth node respectively, is configured to provide a signal of the signal input terminal to the second node and the fourth node under the control of the clock signal terminal and the first power supply terminal; and the output control sub-circuit, electrically connected to the signal output terminal, the first power supply terminal, the third power supply terminal, the first node and the fourth node respectively, is configured to provide a signal of the first power supply terminal or the signal of the third power supply terminal to the signal output terminal under the control of the first node and the fourth node. In the present invention, the pull-up control sub-circuit is configured such that the signal of the second power supply terminal can be provided to the first node quickly, so as to reduce fall time of a signal of the signal output terminal, thereby increasing the driving ability of the shift register.

In an exemplary example, the signal of the first power supply terminal VGH1 and the signal of the second power supply terminal VGH2 may be the same or may be different. The first power supply terminal VGH1 and the second power supply terminal VGH2 may be the same signal terminal when the signal of the first power supply terminal VGH1 is the same as the signal of the second power supply terminal VGH2, at which point the first power supply terminal VGH1 and the second power supply terminal VGH2 may be connected to the same signal line, or may be connected to two different signal lines having the same signal. The first power supply terminal VGH1 and the second power supply terminal VGH2 are different signal terminals when the signal of the first power supply terminal VGH1 is different from the signal of the second power supply terminal VGH2, at which point the signal line to which the first power supply terminal VGH1 is connected is different from the signal line to which the second power supply terminal VGH2 is connected, and a voltage value of the signal line to which the first power supply terminal VGH1 is connected is different from a voltage value of the signal line to which the second power supply terminal VGH2 is connected. Illustratively, the width of the signal line to which the first power supply terminal VGH1 is connected is different from the width of the signal line to which the second power supply terminal VGH2 is connected.

In an exemplary example, a voltage value of the signal of the first power supply terminal VGH1 and a voltage value of the signal of the second power supply terminal VGH2 are greater than a voltage value of the signal of the third power supply terminal VGL.

Figure 2:
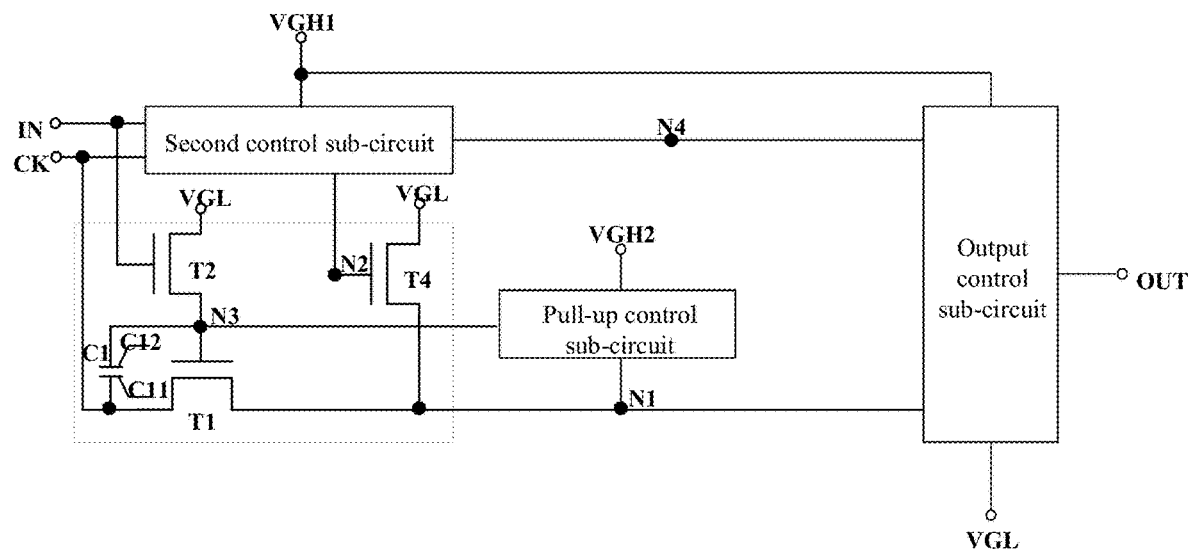
FIG. 2 is an equivalent circuit diagram of a first control sub-circuit in accordance with an exemplary example.

FIG. 2 is an equivalent circuit diagram of a first control sub-circuit in accordance with an exemplary example. As shown in FIG. 2, in an exemplary example, the first control sub-circuit may include a first transistor T1, a second transistor T2, a fourth transistor T4 and a first capacitor C1, the first capacitor C1 including a first plate C11 and a second plate C12.

In an exemplary example, as shown in FIG. 2, a control electrode of the first transistor T1 is electrically connected to the third node N3, a first electrode of the first transistor T1 is electrically connected to the clock signal terminal CK, and a second electrode of the first transistor T1 is electrically connected to the first node N1; a control electrode of the second transistor T2 is electrically connected to the signal input terminal IN, a first electrode of the second transistor T2 is electrically connected to the third power supply terminal VGL, and a second electrode of the second transistor T2 is electrically connected to the third node N3; a control electrode of the fourth transistor T4 is electrically connected to the second node N2, a first electrode of the fourth transistor T4 is electrically connected to the third power supply terminal VGL, and a second electrode of the fourth transistor T4 is electrically connected to the first node N1; the first plate C11 of the first capacitor C1 is electrically connected to the clock signal terminal CK, and the second plate C12 of the first capacitor C1 is electrically connected to the third node N3.

An exemplary structure of the first control sub-circuit is shown in FIG. 2. It is easily understood by those skilled in the art that implementations of the first control sub-circuit are not limited thereto.

Figure 3:
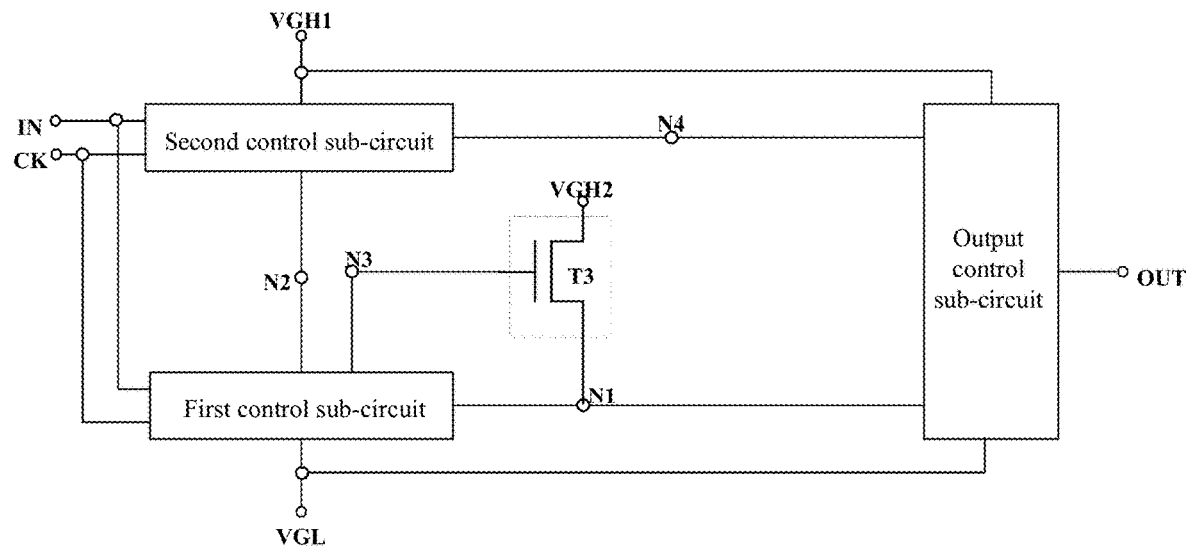
FIG. 3 is an equivalent circuit diagram of a pull-up control sub-circuit in accordance with an exemplary example.

FIG. 3 is an equivalent circuit diagram of a pull-up control sub-circuit in accordance with an exemplary example. As shown in FIG. 3, in an exemplary example, the pull-up control sub-circuit may include a third transistor T3.

In an exemplary example, as shown in FIG. 3, a control electrode of the third transistor T3 is electrically connected to the third node N3, a first electrode of the third transistor T3 is electrically connected to the second power supply terminal VGH2, and a second electrode of the third transistor T3 is electrically connected to the first node N1.

An exemplary structure of the pull-up control sub-circuit is shown in FIG. 3. It is easily understood by those skilled in the art that implementations of the pull-up control sub-circuit are not limited thereto.

When a signal of the third node N3 is an active level signal, the pull-up control sub-circuit in accordance with the present disclosure can cause the third transistor T3 to turn on quickly, and provide the high-level signal of the second power supply terminal to the first node N1, so that the first node N1 can obtain a higher voltage.

Figure 4:
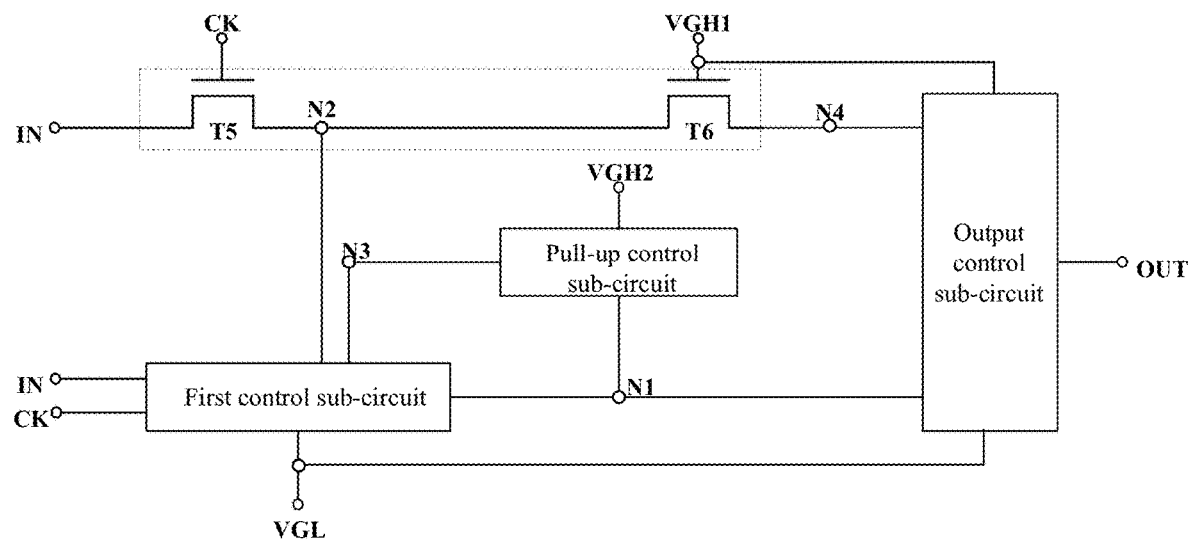
FIG. 4 is an equivalent circuit diagram of a second control sub-circuit in accordance with an exemplary example.

FIG. 4 is an equivalent circuit diagram of a second control sub-circuit in accordance with an exemplary example. As shown in FIG. 4, in an exemplary example, the second control sub-circuit may include a fifth transistor T5 and a sixth transistor T6.

In an exemplary example, as shown in FIG. 4, a control electrode of the fifth transistor T5 is electrically connected to the clock signal terminal CK, a first electrode of the fifth transistor T5 is electrically connected to the signal input terminal IN, and a second electrode of the fifth transistor T5 is electrically connected to the second node N2; a control electrode of the sixth transistor T6 is electrically connected to the first power supply terminal VGH1, a first electrode of the sixth transistor T6 is electrically connected to the second node N2, and a second electrode of the sixth transistor T6 is electrically connected to the fourth node N4.

An exemplary structure of the second control sub-circuit is shown in FIG. 4. It is easily understood by those skilled in the art that implementations of the second control sub-circuit are not limited thereto.

Figure 5:
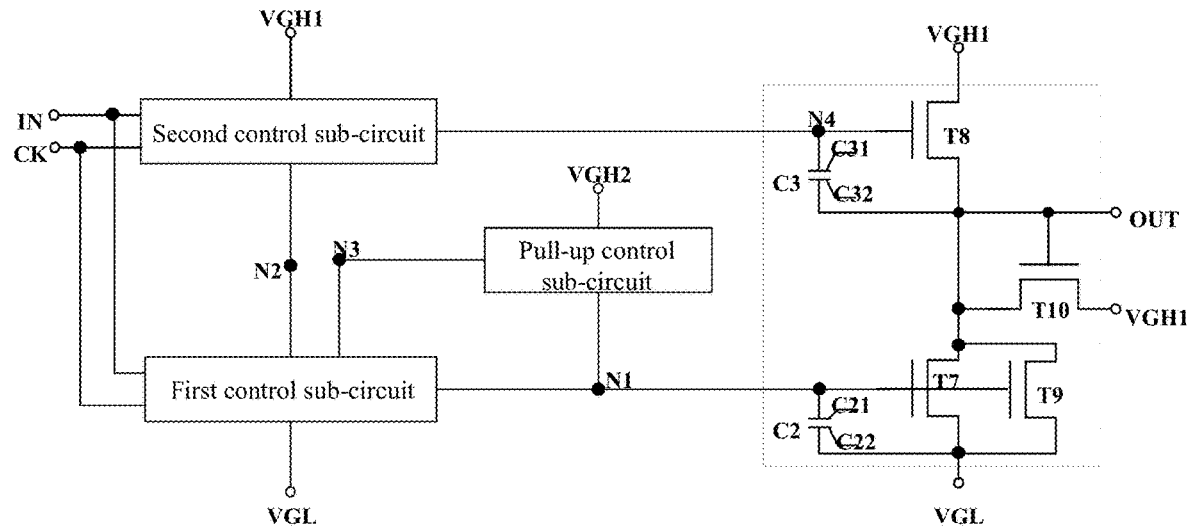
FIG. 5 is an equivalent circuit diagram of an output control sub-circuit in accordance with an exemplary example.

FIG. 5 is an equivalent circuit diagram of an output control sub-circuit in accordance with an exemplary example. As shown in FIG. 5, in an exemplary example, the output control sub-circuit may include a seventh transistor T7, an eighth transistor T8, a ninth transistor T9, a tenth transistor T10, a second capacitor C2 and a third capacitor C3, the second capacitor C2 including a first plate C21 and a second plate C22, and the third capacitor C3 including a first plate C31 and a second plate C32.

In an exemplary example, as shown in FIG. 5, a control electrode of the seventh transistor T7 is electrically connected to the first node N1, a first electrode of the seventh transistor T7 is electrically connected to the third power supply terminal VGL, and a second electrode of the seventh transistor T7 is electrically connected to the signal output terminal OUT; a control electrode of the eighth transistor T8 is electrically connected to the fourth node N4, a first electrode of the eighth transistor T8 is electrically connected to the first power supply terminal VGH1, and a second electrode of the eighth transistor T8 is electrically connected to the signal output terminal OUT; a control electrode of the ninth transistor T9 is electrically connected to the first node N1, a first electrode of the ninth transistor T9 is electrically connected to the third power supply terminal VGL, and a second electrode of the ninth transistor T9 is electrically connected to the signal output terminal OUT; a control electrode and a second electrode of the tenth transistor T10 are electrically connected to the signal output terminal OUT, and a first electrode of the tenth transistor T10 is electrically connected to the first power supply terminal VGH1; the first plate C21 of the second capacitor C2 is electrically connected to the first node N1, and the second plate C22 of the second capacitor C2 is electrically connected to the third power supply terminal VGL; the first plate C31 of the third capacitor C3 is electrically connected to the fourth node N4, and the second plate C32 of the third capacitor C3 is electrically connected to the signal output terminal OUT.

An exemplary structure of the output control sub-circuit is shown in FIG. 5. It is easily understood by those skilled in the art that implementations of the output control sub-circuit are not limited thereto.

Figure 6:
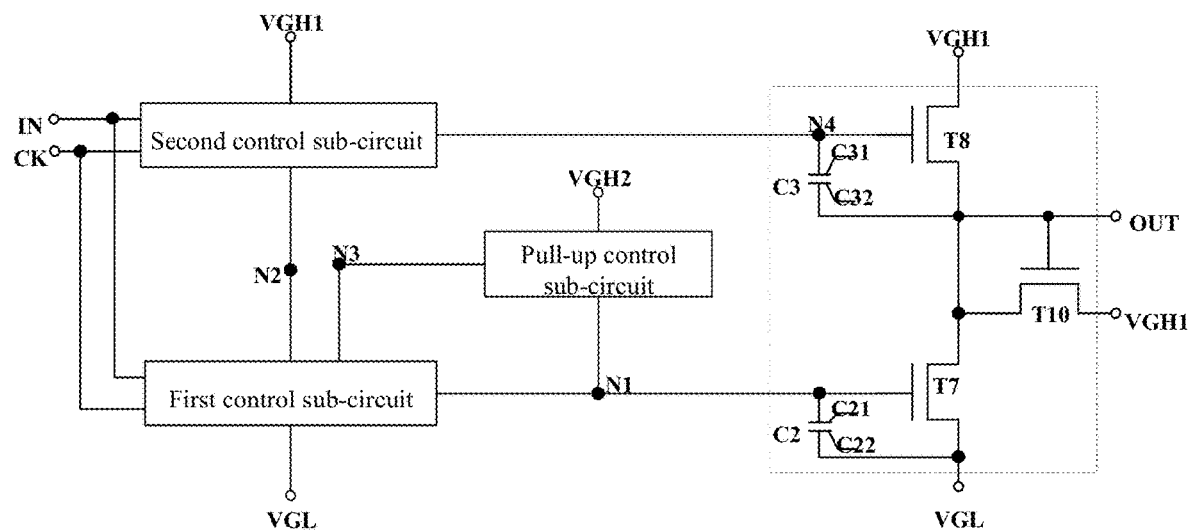
FIG. 6 is an equivalent circuit diagram of an output control sub-circuit in accordance with another exemplary example.

FIG. 6 is an equivalent circuit diagram of an output control sub-circuit in accordance with another exemplary example. As shown in FIG. 6, in an exemplary example, the output control sub-circuit may include a seventh transistor T7, an eighth transistor T8, a tenth transistor T10, a second capacitor C2 and a third capacitor C3, the second capacitor C2 including a first plate C21 and a second plate C22, and the second capacitor C3 including a first plate C31 and a second plate C32.

In an exemplary example, as shown in FIG. 6, a control electrode of the seventh transistor T7 is electrically connected to the first node N1, a first electrode of the seventh transistor T7 is electrically connected to the third power supply terminal VGL, and a second electrode of the seventh transistor T7 is electrically connected to the signal output terminal OUT; a control electrode of the eighth transistor T8 is electrically connected to the fourth node N4, a first electrode of the eighth transistor T8 is electrically connected to the first power supply terminal VGH1, and a second electrode of the eighth transistor T8 is electrically connected to the signal output terminal OUT; a control electrode and a second electrode of the tenth transistor T10 are electrically connected to the signal output terminal OUT, and a first electrode of the tenth transistor T10 is electrically connected to the first power supply terminal VGH1; the first plate of the second capacitor C2 is electrically connected to the first node N1, and the second plater of the second capacitor C2 is electrically connected to the third power supply terminal VGL; the first plate of the third capacitor C3 is electrically connected to the fourth node N4, and the second plate of the third capacitor C3 is electrically connected to the signal output terminal OUT.

An exemplary structure of the output control sub-circuit is shown in FIG. 6. It is easily understood by those skilled in the art that implementations of the output control sub-circuit are not limited thereto.

The difference between the output control sub-circuits provided in FIG. 5 and FIG. 6 is that the ninth transistor T9 connected in parallel to the seventh transistor T7 is included in FIG. 5, so as to add a pathway of the signal provided by the third power supply terminal VGL to the signal output terminal OUT, such that the failure of the shift register due to damage of the seventh transistor can be avoided, thereby increasing the driving ability of the shift register and improving the reliability of the shift register.

Figure 7:
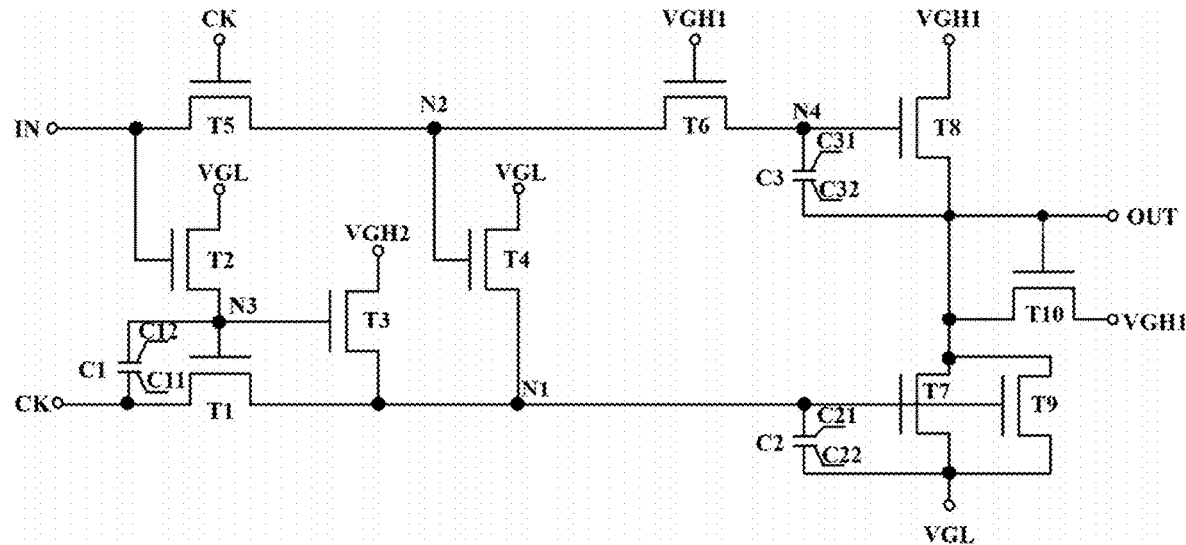
FIG. 7 is an equivalent circuit diagram of a shift register in accordance with an exemplary example.

FIG. 7 is an equivalent circuit diagram of a shift register in accordance with an exemplary example. As shown in FIG. 7, in an exemplary example, the first control sub-circuit includes a first transistor T1, a second transistor T2, a fourth transistor T4 and a first capacitor C1, the second control sub-circuit includes a fifth transistor T5 and a sixth transistor T6, the pull-up control sub-circuit includes a third transistor T3, and the output control sub-circuit includes a seventh transistor T7, an eighth transistor T8, a ninth transistor T9, a tenth transistor T10, a second capacitor C2 and a third capacitor C3, the first capacitor C1 through the third capacitor C3 each including a first plate and a second plate.

As shown in FIG. 7, a control electrode of the first transistor T1 is electrically connected to the third node N3, a first electrode of the first transistor T1 is electrically connected to the clock signal terminal CK, and a second electrode of the first transistor T1 is electrically connected to the first node N1; a control electrode of the second transistor T2 is electrically connected to the signal input terminal IN, a first electrode of the second transistor T2 is electrically connected to the third power supply terminal VGL, and a second electrode of the second transistor T2 is electrically connected to the third node N3; a control electrode of the third transistor T3 is electrically connected to the third node N3, a first electrode of the third transistor T3 is electrically connected to the second power supply terminal VGH2, and a second electrode of the third transistor T3 is electrically connected to the first node N1; a control electrode of the fourth transistor T4 is electrically connected to the second node N2, a first electrode of the fourth transistor T4 is electrically connected to the third power supply terminal VGL, and a second electrode of the fourth transistor T4 is electrically connected to the first node N1; a control electrode of the fifth transistor T5 is electrically connected to the clock signal terminal CK, a first electrode of the fifth transistor T5 is electrically connected to the signal input terminal IN, and a second electrode of the fifth transistor T5 is electrically connected to the second node N2; a control electrode of the sixth transistor T6 is electrically connected to the first power supply terminal VGH1, a first electrode of the sixth transistor T6 is electrically connected to the second node N2, and a second electrode of the sixth transistor T6 is electrically connected to the fourth node N4; a control electrode of the seventh transistor T7 is electrically connected to the first node N1, a first electrode of the seventh transistor T7 is electrically connected to the third power supply terminal VGL, and a second electrode of the seventh transistor T7 is electrically connected to the signal output terminal OUT; a control electrode of the eighth transistor T8 is electrically connected to the fourth node N4, a first electrode of the eighth transistor T8 is electrically connected to the first power supply terminal VGH1, and a second electrode of the eighth transistor T8 is electrically connected to the signal output terminal OUT; a control electrode of the ninth transistor T9 is electrically connected to the first node N1, a first electrode of the ninth transistor T9 is electrically connected to the third power supply terminal VGL, and a second electrode of the ninth transistor T9 is electrically connected to the signal output terminal OUT; a control electrode and a second electrode of the tenth transistor T10 are electrically connected to the signal output terminal OUT, and a first electrode of the tenth transistor T10 is electrically connected to the first power supply terminal VGH1; the first plate C11 of the first capacitor C1 is electrically connected to the clock signal terminal CK, and the second plate C12 of the first capacitor C1 is electrically connected to the third node N3; the first plate C12 of the second capacitor C2 is electrically connected to the first node N1, and the second plate C22 of the second capacitor C2 is electrically connected to the third power supply terminal VGL; the first plate C31 of the third capacitor C3 is electrically connected to the fourth node N4, and the second plate C32 of the third capacitor C3 is electrically connected to the signal output terminal OUT.

In an exemplary example, the transistors can be divided into N-type transistors or P-type transistors according to their characteristics. When the transistor is a P-type transistor, its turn-on voltage is a low-level voltage (e.g., 0V, −5V, −10V or other suitable voltages) and its turn-off voltage is a high-level voltage (e.g., 5V, 10V or other suitable voltages). When the transistor is an N-type transistor, its turn-on voltage is a high-level voltage (e.g., 5V, 10V or other suitable voltages) and its turn-off voltage is a low-level voltage (e.g., 0V, −5V, −10V or other suitable voltages).

In an exemplary example, the first transistor T1 through the tenth transistor T10 may be oxide transistors and are of N-type. The oxide transistors can reduce leakage current, improve the performance of the shift register, and reduce the power consumption of the shift register.

Figure 8:
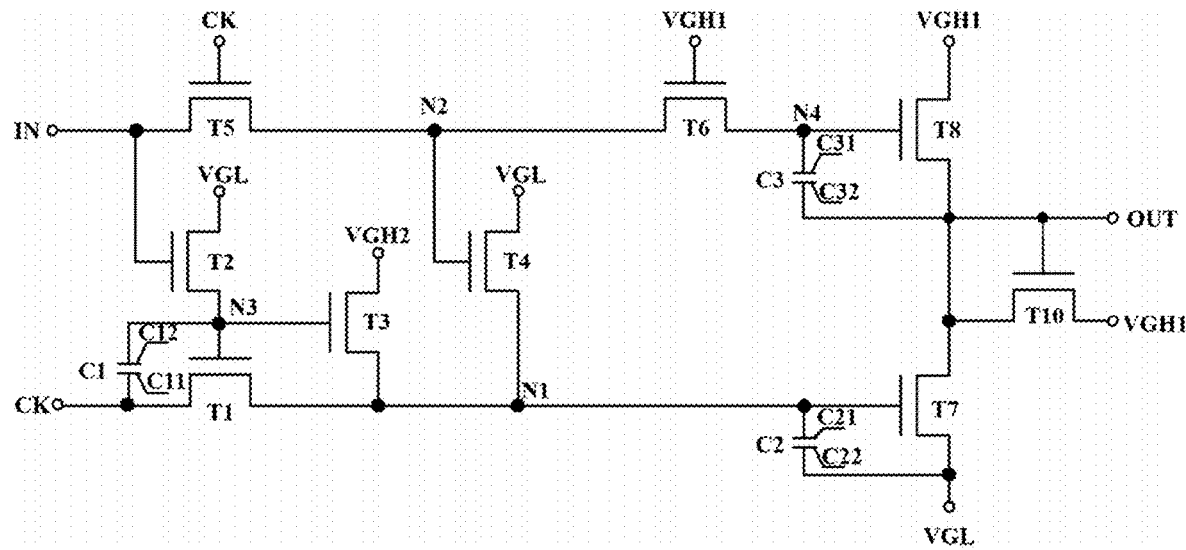
FIG. 8 is an equivalent circuit diagram of a shift register in accordance with another exemplary example.

FIG. 8 is an equivalent circuit diagram of a shift register in accordance with another exemplary example. As shown in FIG. 8, in an exemplary example, the first control sub-circuit includes a first transistor T1, a second transistor T2, a fourth transistor T4 and a first capacitor C1, the second control sub-circuit includes a fifth transistor T5 and a sixth transistor T6, the pull-up control sub-circuit includes a third transistor T3, and the output control sub-circuit includes a seventh transistor T7, an eighth transistor T8, a tenth transistor T10, a second capacitor C2 and a third capacitor C3, the first capacitor C1 through the third capacitor C3 each including a first plate and a second plate.

As shown in FIG. 8, a control electrode of the first transistor T1 is electrically connected to the third node N3, a first electrode of the first transistor T1 is electrically connected to the clock signal terminal CK, and a second electrode of the first transistor T1 is electrically connected to the first node N1; a control electrode of the second transistor T2 is electrically connected to the signal input terminal IN, a first electrode of the second transistor T2 is electrically connected to the third power supply terminal VGL, and a second electrode of the second transistor T2 is electrically connected to the third node N3; a control electrode of the third transistor T3 is electrically connected to the third node N3, a first electrode of the third transistor T3 is electrically connected to the second power supply terminal VGH2, and a second electrode of the third transistor T3 is electrically connected to the first node N1; a control electrode of the fourth transistor T4 is electrically connected to the second node N2, a first electrode of the fourth transistor T4 is electrically connected to the third power supply terminal VGL, and a second electrode of the fourth transistor T4 is electrically connected to the first node N1; a control electrode of the fifth transistor T5 is electrically connected to the clock signal terminal CK, a first electrode of the fifth transistor T5 is electrically connected to the signal input terminal IN, and a second electrode of the fifth transistor T5 is electrically connected to the second node N2; a control electrode of the sixth transistor T6 is electrically connected to the first power supply terminal VGH1, a first electrode of the sixth transistor T6 is electrically connected to the second node N2, and a second electrode of the sixth transistor T6 is electrically connected to the fourth node N4; a control electrode of the seventh transistor T7 is electrically connected to the first node N1, a first electrode of the seventh transistor T7 is electrically connected to the third power supply terminal VGL, and a second electrode of the seventh transistor T7 is electrically connected to the signal output terminal OUT; a control electrode of the eighth transistor T8 is electrically connected to the fourth node N4, a first electrode of the eighth transistor T8 is electrically connected to the first power supply terminal VGH1, and a second electrode of the eighth transistor T8 is electrically connected to the signal output terminal OUT; a control electrode and a second electrode of the tenth transistor T10 are electrically connected to the signal output terminal OUT, and a first electrode of the tenth transistor T10 is electrically connected to the first power supply terminal VGH1; the first plate of the first capacitor C1 is electrically connected to the clock signal terminal CK, and the second plate C12 of the first capacitor C1 is electrically connected to the third node N3; the first plate of the second capacitor C2 is electrically connected to the first node N1, and the second plate C22 of the second capacitor C2 is electrically connected to the third power supply terminal VGL; the first plate C31 of the third capacitor C3 is electrically connected to the fourth node N4, and the second plate C32 of the third capacitor C3 is electrically connected to the signal output terminal OUT.

In an exemplary example, the first transistor T1 through the eighth transistor T8 and the tenth transistor T10 are oxide transistors and are of N-type. The oxide transistors can reduce leakage current, improve the performance of the shift register, and reduce the power consumption of the shift register.

Figure 9:
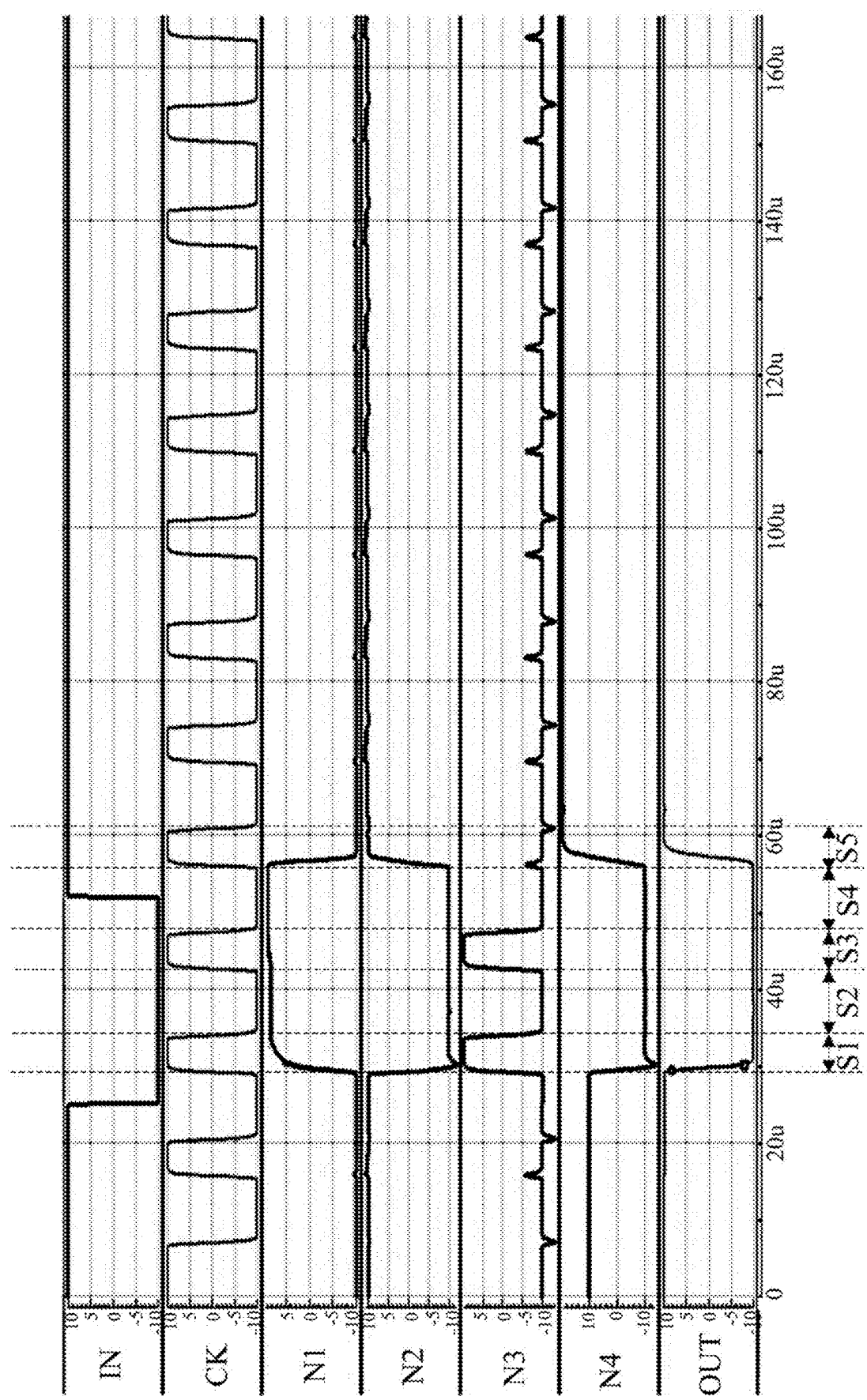
FIG. 9 is a working sequence diagram of a shift register in accordance with an exemplary example.

FIG. 9 is a working sequence diagram of a shift register in accordance with an exemplary example. The exemplary example of the present disclosure will be described below with reference to a working process of the shift register illustrated in FIG. 9. Taking the first transistor T1 through the eighth transistor T8 and the tenth transistor T10 in the shift register provided in FIG. 8 being N-type transistors as an example, the shift register in FIG. 8 includes the first transistors T1 through the eighth transistors T8, the tenth transistor T10, three capacitor (the first capacitor C1 through the third capacitor C3) and three signal terminals (the clock signal terminal CK, the signal input terminal IN and the signal output terminal OUT).

In an exemplary example, as shown in FIG. 9, the working process of the shift register may include the following stages.

In a first stage S1, a signal of the signal input terminal IN is a low-level signal, and a signal of the clock signal terminal CK is a high-level signal. The signal of the clock signal terminal CK is a high-level signal, the fifth transistor T5 is turned on, the low-level signal of the signal input terminal IN is transmitted to the second node N2 through the turned-on fifth transistor T5, the fourth transistor T4 is turned off, a signal of the second node N2 is transmitted to the fourth node N4 through the turned-on sixth transistor T6, the seventh transistor T7 is turned off, a high-level signal of the first high-level power supply terminal VGH1 cannot be written to the signal output terminal OUT, the signal of the signal input terminal IN is a low-level signal, the second transistor T2 is turned off, the signal of the clock signal terminal CK is a high-level signal, a signal of the third node N3 is pulled up to become a high-level signal, the first transistor T1 and the third transistor T3 are turned on, a high-level signal of the second high-level power supply terminal is written to the first node N1 through the turned-on third transistor T3, a signal of the first node N1 is a high-level signal, the seventh transistor T7 is turned on, a low-level signal of the low-level power supply terminal VGL is transmitted to the signal output terminal OUT through the turned-on seventh transistor T7, and the tenth transistor T10 is turned off. In this stage, the signal of the first node N1 is a high-level signal, the signal of the second node N2 is a low-level signal, the signal of the third node N3 is a high-level signal, a signal of the fourth node N4 is a low-level signal, and a signal of the signal output terminal OUT is a low-level signal.

In a second stage S2, the signals of the signal input terminal IN and the clock signal terminal CK are high-level signals. The signal of the clock signal terminal CK is a low-level signal, the fifth transistor T5 is turned off, the second node N2 and the fourth node N4 maintain the low-level signal of the previous stage, the fourth transistor T4 and the eighth transistor T8 are turned off, the high-level signal of the first high-level power supply terminal VGH1 cannot be written to the signal output terminal OUT, the signal of the signal input terminal IN is a low-level signal, the second transistor T2 is turned off, the signal of the clock signal terminal CK is a low-level signal, the signal of the third node N3 is pulled down to become a low-level signal, the first transistor T1 and the third transistor T3 are turned off, the first node N1 maintains the high-level signal of the previous stage, the seventh transistor T7 is turned on, the low-level signal of the low-level power supply terminal VGL is transmitted to the signal output terminal OUT through the turned-on seventh transistor T7, and the tenth transistor T10 is turned off. In this stage, the signal of the first node N1 is a high-level signal, the signal of the second node N2 is a low-level signal, the signal of the third node N3 is a low-level signal, the signal of the fourth node N4 is a low-level signal, and the signal of the signal output terminal OUT is a low-level signal.

In a third stage S3, the signal of the signal input terminal IN is a low-level signal, and the signal of the clock signal terminal CK is a high-level signal. The signal of the clock signal terminal CK is a high-level signal, the fifth transistor T5 is turned on, the low-level signal of the signal input terminal IN is transmitted to the second node N2 through the turned-on fifth transistor T5, the fourth transistor T4 is turned off, the signal of the second node N2 is transmitted to the fourth node N4 through the turned-on sixth transistor T6, the eighth transistor T8 is turned off, the high-level signal of the first high-level power supply terminal VGH1 cannot be written to the signal output terminal OUT, the signal of the signal input terminal IN is a low-level signal, the second transistor T2 is turned off, the signal of the clock signal terminal CK is a high-level signal, the signal of the third node N3 is pulled up to become a high-level signal, the first transistor T1 and the third transistor T3 are turned on, the high-level signal of the second high-level power supply terminal is written to the first node N1 through the turned-on third node N3, the signal of the first node N1 is a high-level signal, the seventh transistor T7 is turned on, the low-level signal of the low-level power supply terminal VGL is transmitted to the signal output terminal OUT through the turned-on seventh transistor T7, and the tenth transistor T10 is turned off. In this stage, the signal of the first node N1 is a high-level signal, the signal of the second node N2 is a low-level signal, the signal of the third node N3 is a high-level signal, the signal of the fourth node N4 is a low-level signal, and the signal of the signal output terminal OUT is a low-level signal.

In a fourth stage S4, the signal of the clock signal terminal CK is a low-level signal, and the signal of the signal input terminal IN is a low-level signal during a first period of time and is a high-level signal during a second period of time. The first period of time precedes the second period of time, and the sum of the first period of time and the second period of time is equal to a duration during which the signal of the clock signal terminal CK is a low-level signal. The signal of the clock signal terminal CK is a low-level signal, the fifth transistor T5 is turned off, the second node N2 and the fourth node N4 maintain the low-level signal of the previous stage, the fourth transistor T4 and the eighth transistor T8 are turned off, the high-level signal of the first high-level power supply terminal VGH1 cannot be written to the signal output terminal OUT, the signal of the signal input terminal IN is a low-level signal, the second transistor T2 is turned off, the signal of the clock signal terminal CK is a low-level signal, the signal of the third node N3 is pulled down to become a low-level signal, the first transistor T1 and the third transistor T3 are turned off, the first node N1 maintains the high-level signal of the previous stage, the seventh transistor T7 is turned on, the low-level signal of the low-level power supply terminal VGL is transmitted to the signal output terminal OUT through the turned-on seventh transistor T7, and the tenth transistor T10 is turned off. In this stage, the signal of the first node N1 is a high-level signal, the signal of the second node N2 is a low-level signal, the signal of the third node N3 is a low-level signal, the signal of the fourth node N4 is a low-level signal, and the signal of the signal output terminal OUT is a low-level signal.

In a fifth stage S5, the signals of the signal input terminal IN and the second clock signal terminal CB are low-level signals. The signal of the clock signal terminal CK is a high-level signal, the fifth transistor T5 is turned on, the high-level signal of the signal input terminal IN is transmitted to the second node N2 through the turned-on fifth transistor T5, the fourth transistor T4 is turned on, the signal of the second node N2 is transmitted to the fourth node N4 through the turned-on sixth transistor T6, the eighth transistor T8 is turned on, and the high-level signal of the first high-level power supply terminal VGH1 is transmitted to the signal output terminal OUT, at which point the tenth transistor T10 is turned on, and the high-level signal of the first high-level power supply terminal VGH1 is continuously transmitted to the signal output terminal OUT. Although the signal of the clock signal terminal CK is a high-level signal such that the third node N3 can be pulled up, the signal of the signal input terminal IN is a high-level signal such that the second transistor T2 is turned on, the low-level signal of the low-level power supply terminal VGL is written to the third node N3 through the turned-on second transistor T2, the first transistor T1 and the third transistor T3 are turned off, the signal of the second node N2 is a high-level signal, the fourth transistor T4 is turned on, and the low-level signal of the low-level power supply terminal VGL is transmitted to the first node N1 through the turned-on fourth transistor T4, so that the signal of the first node N1 is a low-level signal, the seventh transistor T7 is turned off, and the low-level signal of the low-level power supply terminal VGL cannot be transmitted to the signal output terminal OUT. In this stage, the signal of the first node N1 is a low-level signal, the signal of the second node N2 is a high-level signal, the signal of the third node N3 is a low-level signal, the signal of the fourth node N4 is a high-level signal, and the signal of the signal output terminal OUT is a high-level signal.

In an exemplary example, when the signal of the third node N3 is a high-level signal, the third transistor T3 is turned on quickly, and the high-level signal of the second power supply terminal is provided to the first node N1, so that the first node N1 can obtain a higher voltage, and the seventh transistor T7 is turned on quickly, so as to reduce the fall time of the signal of the signal output terminal, thereby increasing the driving ability of the shift register.

The working sequence diagram of the shift register provided in FIG. 9 is also applicable to the shift register provided in FIG. 7, the only difference is that in the shift register provided in FIG. 7, when the seventh transistor T7 is turned on, the ninth transistor T9 is turned on as well, to write the signal of the third power supply terminal VGL to the signal output terminal OUT.

The example of the present disclosure further provides a display substrate including a substratum and a circuit structure layer disposed on the substratum, wherein the circuit structure layer includes a gate driving circuit, which includes a plurality of cascaded shift registers; a signal output terminal of an i-th stage shift register is electrically connected to a signal input terminal of an (i+1)-th stage shift register, $1 \leq i \leq M-1$ and M being the total number of stages of the shift registers.

In an exemplary example, each of the shift register may include a first control sub-circuit, a second control sub-circuit, a pull-up control sub-circuit and an output control sub-circuit. The first control sub-circuit, electrically connected to a signal input terminal, a clock signal terminal, a third power supply terminal, a first node, a second node and a third node respectively, is configured to provide a signal of the third power supply terminal or the clock signal terminal to the first node and the third node under the control of the signal input terminal, the clock signal terminal and the second node; the pull-up control sub-circuit, electrically connected to a second power supply terminal, the first node and the third node respectively, is configured to provide a signal of the second power supply terminal to the first node under the control of the third node; the second control sub-circuit, electrically connected to the clock signal terminal, the signal input terminal, a first power supply terminal, the second node and a fourth node respectively, is configured to provide a signal of the signal input terminal to the second node and the fourth node under the control of the clock signal terminal and the first power supply terminal; the output control sub-circuit, electrically connected to the signal output terminal, the first power supply terminal, the third power supply terminal, the first node and the fourth node respectively, is configured to provide a signal of the first power supply terminal or the signal of the third power supply terminal to the signal output terminal under the control of the first node and the fourth node.

The shift register may be the shift register in accordance with any one of the aforementioned examples, and its implementation principle and implementation effect are similar to the foresaid implementation principle and implementation effect and will not be repeated herein.

For different display products, cascade relationships of the plurality of shift registers in the gate driving circuit may be different. Regardless of the cascade relationships of the plurality of shift registers and no matter how many rows of sub-pixels are driven by each of the shift registers, as long as such a large-area device is changed and such a change generates additional space, both possible simple translation and stretching of a small device are within the protection scope of the present disclosure.

In an exemplary example, the display substrate in accordance with the present disclosure may be applied to a display device with a gate driving circuit, such as an OLED, a quantum dot display (QLED), a light emitting diode display (Micro LED or Mini LED) or a quantum dot light emitting diode display (QDLED), etc., the present disclosure is not limited thereto.

In an exemplary example, the circuit structure layer may further include a pixel circuit and a reset signal line, a light emitting signal line and a scan signal line which are connected to the pixel circuit. The gate driving circuit may provide signals to at least one of the reset signal line, the light emitting signal line and the scan signal line.

In an exemplary example, the display substrate may further include a light emitting structure layer located on one side of the circuit structure layer away from the substratum. The light emitting structure layer includes light emitting elements, which are arranged in an array, located in a display area.

In an exemplary example, the light emitting elements may be organic light emitting diodes (OLEDs) or quantum dot light emitting diodes (QLEDs). The OLED may include a first electrode (anode), an organic light emitting layer and a second electrode (cathode) that are stacked.

In an exemplary example, the display substrate may further include other film layers, such as photo spacers, the present disclosure is not limited thereto.

Figure 10:
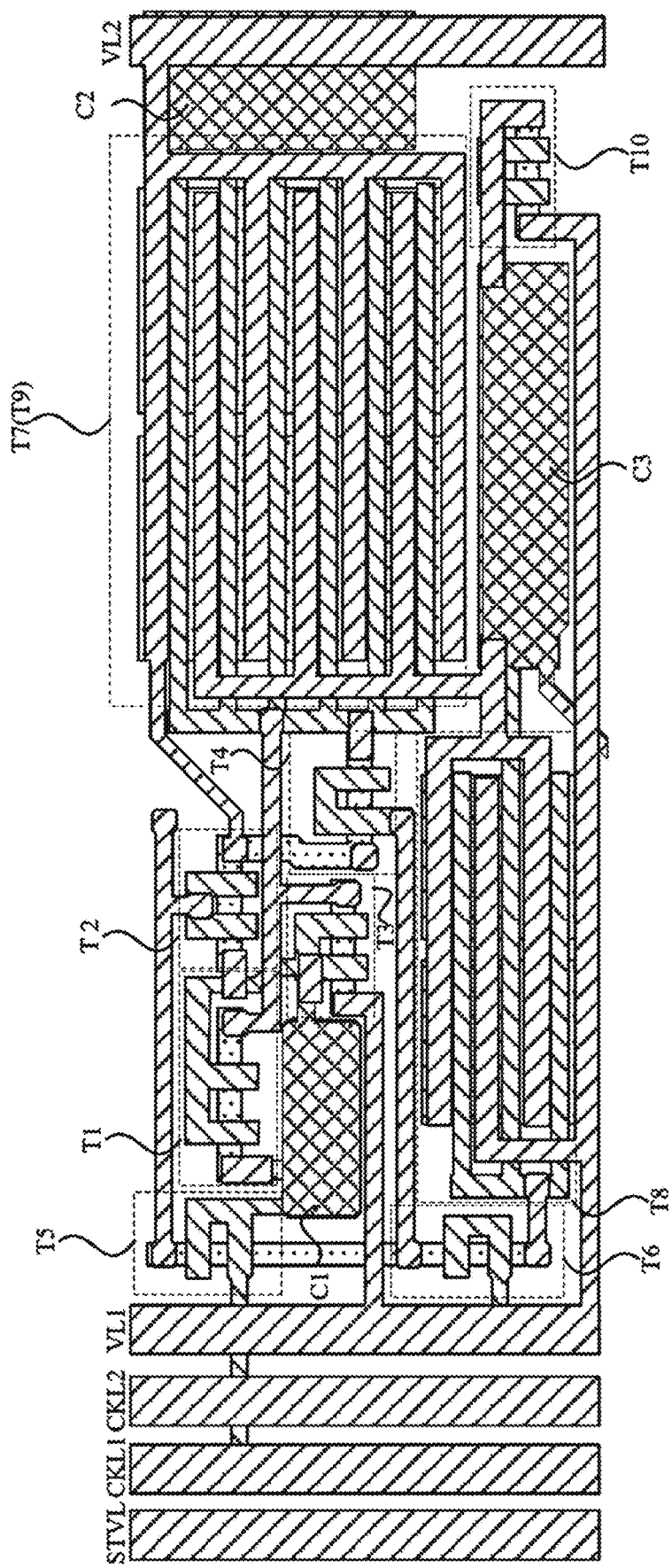
FIG. 10 is a schematic diagram of a circuit structure layer in accordance with an exemplary example.

FIG. 10 is a schematic diagram of a circuit structure layer in accordance with an exemplary example. In an exemplary example, as shown in FIG. 10, the circuit structure layer further includes an initial signal line STVL, a first clock signal line CLK1, a second clock signal line CLK2, a first power supply line VL1 and a second power supply line VL2 extending along a first direction, the initial signal line STVL, the first clock signal line CLK1, the second clock signal line CLK2, the first power supply line VL1 and the second power supply line VL2 being arranged along a second direction, and the first direction intersecting the second direction. FIG. 10 is illustrated by taking the gate driving circuit including the shift register provided in FIG. 8 as an example. FIG. 10 can also be applied to the shift register provided in FIG. 7, at which point the seventh transistor is reused as the ninth transistor.

A signal input terminal of a first stage shift register is electrically connected to the initial signal line, first power supply terminals and second power supply terminals of all the shift registers are electrically connected to the first power supply line, third power supply terminals of all the shift registers are electrically connected to the second power supply line, a clock signal terminal of an i-th stage shift register is electrically connected to one of the first clock signal line and the second clock signal line, and a clock signal terminal of an (i+1)-th stage shift register is electrically connected to the other one of the first clock signal line and the second clock signal line.

The circuit structure layer includes a semiconductor layer, a first insulating layer, a first conductive layer, a second insulating layer, a second conductive layer, a third insulating layer and a third conductive layer which are sequentially stacked on the substratum.

The semiconductor layer includes active layers of all transistors located in the gate driving circuit.

The first conductive layer includes control electrodes of all the transistors and a first plate of a first capacitor through a first plate of a third capacitor, which are located in the gate driving circuit.

The second conductive layer includes a second plate of the first capacitor through a second plate of the third capacitor, which are located in the gate driving circuit.

The third conductive layer includes the initial signal line, the first clock signal line, the second clock signal line, the first power supply line, the second power supply line and first and second electrodes of all the transistors located in the gate driving circuit.

In an exemplary example, as shown in FIG. 10, the third transistor T3 is located between the first capacitor C1 and the fourth transistor T4; a virtual straight line extending along the second direction passes through the active layer of the third transistor and the first plate of the first capacitor; a virtual straight line extending along the second direction passes through the first plate of the first capacitor, the control electrode of the third transistor and the control electrode of the fourth transistor.

In an exemplary example, the semiconductor layer further includes an active connection line configured to connect the active layer of the second transistor with the active layer of the fourth transistor. An orthographic projection of the second electrode of the first transistor on the substratum overlaps at least partially with an orthographic projection of the active connection line on the substratum.

In an exemplary example, the first conductive layer further includes a first connection line and a second connection line. The control electrode of the first transistor, the control electrode of the third transistor and the first connection line form an integrated structure, and the control electrode of the first transistor and the control electrode of the third transistor are located at both sides of the first connection line respectively, the first plate of the first capacitor, the control electrode of the fifth transistor and the second connection line form an integrated structure, and the control electrode of the fifth transistor and the second connection line are located at the same side of the first plate of the first capacitor.

In an exemplary example, an orthographic projection of the first electrode of the first transistor on the substratum overlaps at least partially with an orthographic projection of the second connection line on the substratum; an orthographic projection of the second electrode of the first transistor on the substratum overlaps at least partially with an orthographic projection of the first connection line on the substratum.

In an exemplary example, the second plate of the first capacitor includes a first capacitor body part and a first capacitor connection part connected to each other, the first capacitor connection part being located at one side of the first capacitor body part close to the second plate of the second capacitor. An orthographic projection of the first capacitor body part on the substratum overlaps at least partially with an orthographic projection of the first plate of the first capacitor on the substratum, and there is no overlapping area between an orthographic projection of the first capacitor connection part on the substratum and the orthographic projection of the first plate of the first capacitor on the substratum.

In an exemplary example, the second plate of the third capacitor includes a third capacitor body part and a third capacitor connection part connected to each other, the third capacitor connection part being located at one side of the third capacitor body part close to the second plate of the first capacitor. An orthographic projection of the third capacitor body part on the substratum overlaps at least partially with an orthographic projection of the first plate of the third capacitor on the substratum, and there is no overlapping area between an orthographic projection of the third capacitor connection part on the substratum and the orthographic projection of the first plate of the third capacitor on the substratum.

In an exemplary example, the initial signal line, the first clock signal line, the second clock signal line, the first power supply line and the second power supply line extend along the first direction and are arranged along the second direction, the first direction intersecting the second direction. The initial signal line is located at one side of the first capacitor away from the second capacitor, the first clock signal line is located at one side of the initial signal line close to the first capacitor, the second clock signal line is located at one side of the first clock signal line close to the first capacitor, the first power supply line is located at one side of the second clock signal line close to the first capacitor, and the second power supply line is located at one side of the seventh transistor away from the first capacitor.

In an exemplary example, the third conductive layer further includes a third connection line. An orthographic projection of the third connection line on the substratum overlaps at least partially with orthographic projections of the first capacitor connection part and the control electrode of the third transistor on the substratum, and the third connection line is electrically connected to the control electrode of the third transistor and the first capacitor connection part.

In an exemplary example, an orthographic projection of the first electrode of the fifth transistor on the substratum overlaps partially with an orthographic projection of the third capacitor connection part of the shift register at the previous stage on the substratum, and the first electrode of the fifth transistor is connected to the third capacitor connection part of the shift register at the previous stage.

In an exemplary example, the orthographic projection of the third capacitor connection part on the substratum overlaps at least partially with an orthographic projection of the first electrode of the tenth transistor on the substratum; the orthographic projection of the third capacitor body part on the substratum overlaps at least partially with orthographic projections of the second electrode of the eighth transistor and the second electrode of the tenth transistor on the substratum, and the third capacitor body part is connected to the second electrode of the eighth transistor and the second electrode of the tenth transistor, respectively.

In an exemplary example, an orthographic projection of the first power supply line on the substratum overlaps at least partially with orthographic projections of the control electrode of the fifth transistor and the control electrode of the sixth transistor on the substratum; an orthographic projection of the second power supply line on the substratum overlaps at least partially with an orthographic projection of the second plate of the second capacitor on the substratum.

A manufacturing process of the display substrate will be described below by way of example. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Film" refers to a layer of film formed from a certain material on a substratum using deposition, coating or other processes. If the "film" does not need to be processed through the patterning processes in the entire manufacturing process, the "film" may also be called a "layer". If the "film" needs to be processed through the patterning processes in the entire manufacturing process, the "film" is called a "film" before the patterning processes are performed and is called a "layer" after the patterning processes are performed. At least one "pattern" is contained in the "layer" which has been processed through the patterning processes. "A and B being disposed on the same layer" mentioned in the present disclosure means that A and B are formed simultaneously through the same running of the patterning processes, and the "thickness" of the film layer is the dimension of the film layer in a direction perpendicular to the display substrate. In the exemplary example of the present disclosure, "an orthographic projection of B being within the range of an orthographic projection of A" or "an orthographic projection of A containing an orthographic projection of B" means that the boundary of the orthographic projection of B falls within the range of the boundary of the orthographic projection of A, or the boundary of the orthographic projection of A overlaps with the boundary of the orthographic projection of B. FIGS. 11 to 18 are illustrated by taking the display substrate including the shift register provided in FIG. 8, that is, the shift register including the first transistor T1 through the eighth transistor T8 and the tenth transistor T10, as an example.

Figure 11:
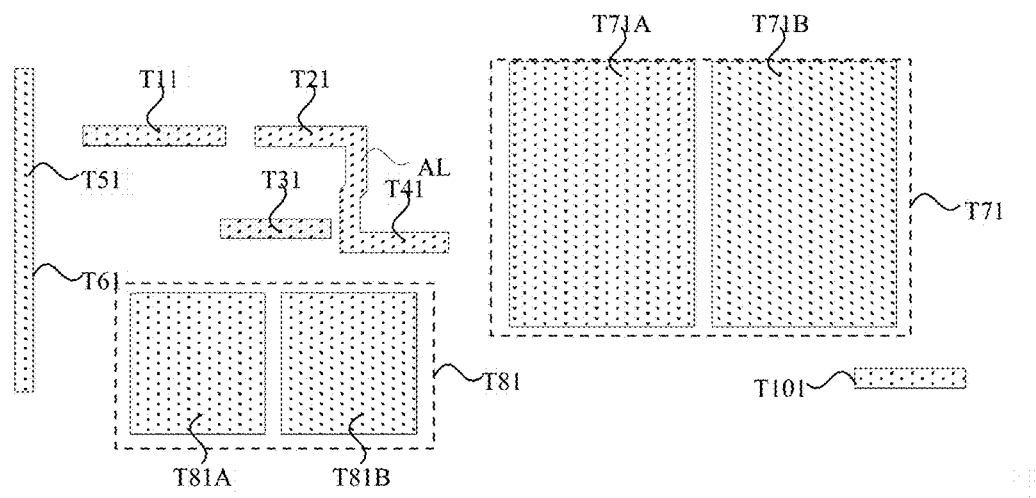
FIG. 11 is a schematic diagram of a semiconductor layer after its patterns are formed.

(1) Forming patterns of a semiconductor layer on a substratum includes: depositing a semiconductor film on the substratum, and patterning the semiconductor film through the patterning processes to form the patterns of the semiconductor layer, as shown in FIG. 11. FIG. 11 is a schematic diagram of the semiconductor layer after its patterns are formed.

In an exemplary example, as shown in FIG. 11, the patterns of the semiconductor layer may include an active layer T11 of a first transistor through an active layer T81 of an eighth transistor, an active layer T101 of a tenth transistor and an active connection line AL.

In an exemplary example, the substratum may be a rigid substratum or a flexible substratum. The rigid substratum may be, but be not limited to, one or more of glass and metal foil; the flexible substratum may be, but be not limited to, one or more of polyethylene terephthalate, ethylene terephthalate, polyether ether ketone, polystyrene, polycarbonate, polyarylate, polyarylester, polyimide, polyvinyl chloride, polyethylene and textile fibers.

In an exemplary embodiment, the flexible substratum may include a first flexible material layer, a first inorganic material layer, a semiconductor layer, a second flexible material layer and a second inorganic material layer which are stacked. Materials of the first and second flexible material layers may be polyimide (PI), polyethylene terephthalate (PET) or surface treated polymer soft films, and materials of the first and second inorganic material layers may be silicon nitride (SiNx) or silicon oxide (SiOx), for improving the water and oxygen resistance performance of the substratum. The first and second inorganic material layers may also be referred to as barrier layers. A material of the semiconductor layer may be amorphous silicon (a-si). In an exemplary embodiment, taking a stacked structure of PI1/Barrier1/a-si/PI2/Barrier2 as an example, its manufacturing process may include: first coating a layer of polyimide on a glass carrier board, to form a first flexible (PI1) layer after the layer of polyimide is cured; then depositing a layer of barrier film on the first flexible layer to form a first barrier (Barrier 1) layer overlaying the first flexible layer; then depositing a layer of amorphous silicon film on the first barrier layer to form an amorphous silicon (a-si) layer overlaying the first barrier layer; then coating another layer of polyimide on the amorphous silicon layer, to form a second flexible (PI2) layer after the layer of polyimide is cured; and then depositing a layer of barrier film on the second flexible layer to form a second barrier (Barrier 2) layer overlaying the second flexible layer, so as to complete the manufacturing of the substratum.

In an exemplary example, the semiconductor film may be made of various materials, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene and polythiophene, that is, the present disclosure is applicable to transistors manufactured based on oxide technology, silicon technology and organic matter technology.

In an exemplary example, as shown in FIG. 11, the active layer T21 of the first transistor extends, the active layer T41 of the fourth transistor and the active connection line AL form an integrated structure, and the active layer T51 of the fifth transistor and the active layer T61 of the sixth transistor form an integrated structure.

In an exemplary example, as shown in FIG. 11, the active layer T11 of the first transistor through the active layer T41 of the fourth transistor and the active layer T101 of the tenth transistor may be strip-shaped and extend along the second direction. The integrated structure of the active layer T51 of the fifth transistor and the active layer T61 of the sixth transistor may be strip-shaped and extend along the first direction.

In an exemplary example, as shown in FIG. 11, a virtual straight line extending along the second direction passes through the active layer T11 of the first transistor and the active layer T21 of the second transistor.

In an exemplary example, as shown in FIG. 11, the active layer T71 of the seventh transistor may include a first sub-active layer T71A and a second sub-active layer T71B. The first sub-active layer T71A and the second sub-active layer T71B are strip-shaped and extend along the first direction. The first sub-active layer T71A and the second sub-active layer T71B are arranged along the second direction.

In an exemplary example, as shown in FIG. 11, the area of the first sub-active layer T71A may or may not be equal to the area of the second sub-active layer T71B. When the area of the first sub-active layer T71A is not equal to the area of the second sub-active layer T71B, the area of the first sub-active layer T71A may be greater than or less than the area of the second sub-active layer T71B, the present disclosure is not limited thereto.

In an exemplary example, as shown in FIG. 11, the active layer T81 of the eighth transistor may include a third sub-active layer T81A and a fourth sub-active layer T81B. The third sub-active layer T81A and the fourth sub-active layer T81B are strip-shaped and extend along the first direction. The third sub-active layer T81A and the fourth sub-active layer T81B are arranged along the second direction.

In an exemplary example, as shown in FIG. 11, the area of the third sub-active layer T81A may or may not be equal to the area of the fourth sub-active layer T81B. When the area of the third sub-active layer T81A is not equal to the area of the fourth sub-active layer T81B, the area of the third sub-active layer T81A may be greater than or less than the area of the fourth sub-active layer T81i, the present disclosure is not limited thereto.

In an exemplary example, as shown in FIG. 11, the areas of the first sub-active layer T71A and the second sub-active layer T71B may be greater than the areas of the third sub-active layer T81A and the fourth sub-active layer T81B.

In an exemplary example, as shown in FIG. 11, the integrated structure of the active layer T51 of the fifth transistor and the active layer T61 of the sixth transistor is located at one side of the active layer T11 of the first transistor away from the active layer T21 of the second transistor. The active layer T21 of the second transistor is located at one side of the active connection line AL close to the active layer T11 of the first transistor. The active layer T41 of the fourth transistor is located at one side of the active connection line AL away from the active layer T11 of the first transistor. The active layer T31 of the third transistor is located at one side of the active connection line AL close to the active layer T11 of the first transistor and at one side of the active layer T21 of the second transistor close to the active layer T81 of the eighth transistor. The active layer T71 of the seventh transistor is located at one side of the active layer T41 of the fourth transistor away from the active connection line AL. The active layer T81 of the eighth transistor is located at one side of the integrated structure of the active layer T51 of the fifth transistor and the active layer T61 of the sixth transistor close to the active layer T71 of the seventh transistor and at one side of the active layer T31 of the third transistor away from the active layer T21 of the second transistor. The active layer T101 of the tenth transistor is located at one side of the active layer of the eighth transistor away from the integrated structure of the active layer T51 of the fifth transistor and the active layer T61 of the sixth transistor.

Figure 12:
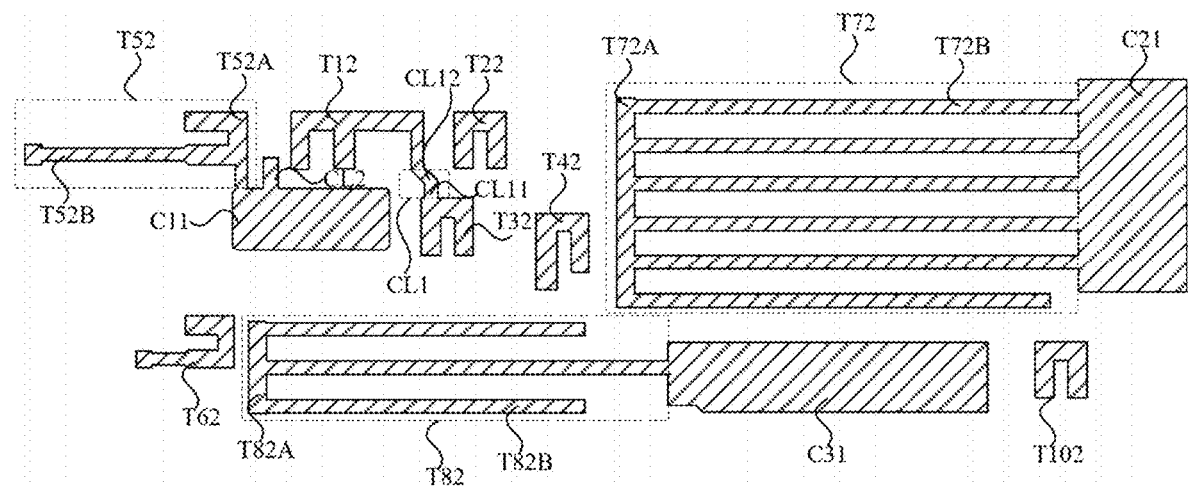
FIG. 12 is a schematic diagram of patterns of a first conductive layer.
Figure 13:
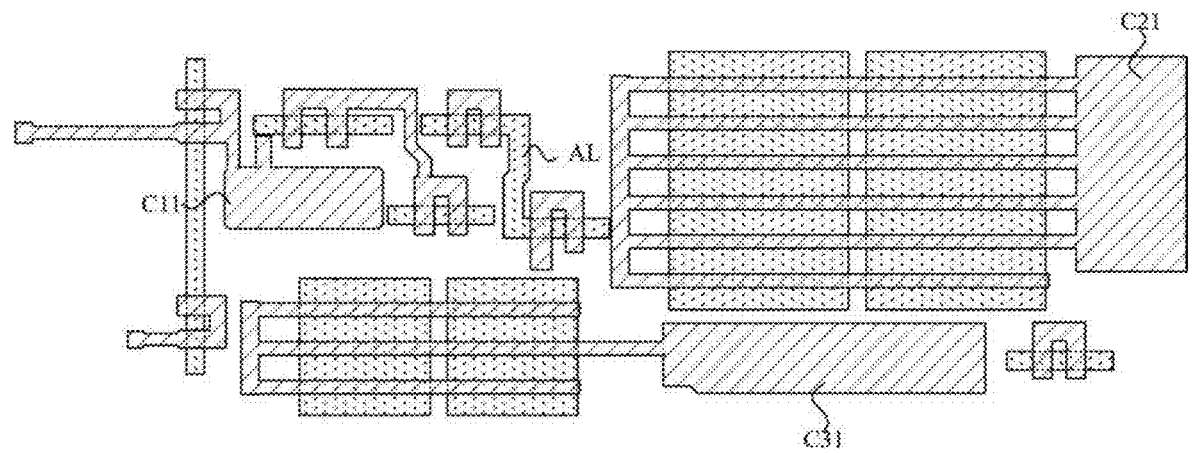
FIG. 13 is a schematic diagram of a first conductive layer after its patterns are formed.

(2) Forming patterns of a first conductive layer includes: depositing a first insulating film and a first conductive film on the substratum, on which the aforementioned patterns are formed, and patterning the first insulating film and the first conductive film through the patterning processes to form patterns of a first insulating layer and the patterns of the first conductive layer disposed on the patterns of the first insulating layer, as shown in FIGS. 12 and 13. FIG. 12 is a schematic diagram of the patterns of the first conductive layer, and FIG. 13 is a schematic diagram of the first conductive layer after its patterns are formed.

In an exemplary example, as shown in FIGS. 12 and 13, the patterns of the first conductive layer may include a control electrode T12 of the first transistor through a control electrode T82 of the eighth transistor, a control electrode T102 of the tenth transistor, a first plate C11 of a first capacitor through a first plate C31 of a third capacitor, a first connection line CL1 and a second connection line CL2.

In an exemplary example, the first conductive film may be made of a metal material, such as any one or more of silver (Ag), copper (Cu), aluminum (Al), titanium (Ti) and molybdenum (Mo), or an alloy material of the aforementioned metals, such as aluminum neodymium alloy (AlNd) or molybdenum niobium alloy (MoNb), and may be a single-layered structure or a multi-layered composite structure, such as Ti/Al/Ti, etc.

In an exemplary example, the first insulating film may be made of any one or more of silicon oxide (SiOx), silicon nitride (SiNx) and silicon oxynitride (SiON), and may be a single-layer, multi-layers or a composite layer. The first insulating layer may be referred to as a first gate insulating layer.

In an exemplary example, as shown in FIGS. 12 and 13, the control electrode T12 of the first transistor, the control electrode T32 of the third transistor and the first connection line CL1 form an integrated structure. The first plate C11 of the first capacitor, the control electrode T52 of the fifth transistor and the second connection line CL2 form an integrated structure. The control electrode T72 of the seventh transistor and the first plate C21 of the second capacitor form an integrated structure. The control electrode T82 of the eighth transistor and the first plate C31 of the third capacitor form an integrated structure.

In an exemplary example, as shown in FIGS. 12 and 13, the first plate C11 of the first capacitor may be in the shape of a square, and may be located at one side of the control electrode T52 of the fifth transistor and the second connection line CL2 close to the control electrode T82 of the eighth transistor.

In an exemplary example, as shown in FIGS. 12 and 13, the first plate C21 of the second capacitor may be in the shape of a square, and may be located at one side of the control electrode T72 of the seventh transistor away from the control electrode T22 of the second transistor.

In an exemplary example, as shown in FIGS. 12 and 13, the first plate C31 of the third capacitor may be in the shape of a square, and may be located at one side of the control electrode T82 of the eighth transistor close to the control electrode T102 of the tenth transistor.

In an exemplary example, as shown in FIGS. 12 and 13, the area of the first plate C21 of the second capacitor may be greater than that of the first plate C31 of the third capacitor, and the area of the first plate C31 of the third capacitor may be greater than that of the first plate C11 of the first capacitor.

In an exemplary example, as shown in FIGS. 12 and 13, the control electrode T12 of the first transistor may be located at one side of the first plate C11 of the first capacitor close to the control electrode T52 of the fifth transistor. The control electrode T12 of the first transistor may be in the shape of an "m", and two openings facing the control electrode T82 of the eighth transistor are provided in the control electrode T12 of the first transistor, one of the openings being close to the control electrode T22 of the second transistor and the other one of the openings being close to the control electrode T52 of the fifth transistor. The size of the opening close to the control electrode T22 of the second transistor along the second direction is greater than the size of the opening close to the control electrode T52 of the fifth transistor along the second direction.

In an exemplary example, as shown in FIGS. 12 and 13, the control electrode T32 of the third transistor may be located at one side of the first plate C11 of the first capacitor close to the control electrode T42 of the fourth transistor. The control electrode T32 of the third transistor may be in the shape of an "n", and an opening facing the control electrode T82 of the eighth transistor is provided in the control electrode T32 of the third transistor.

In an exemplary example, as shown in FIGS. 12 and 13, the first connection line CL1 may be located at one side of the first plate C11 of the first capacitor close to the control electrode T42 of the fourth transistor.

In an exemplary example, as shown in FIGS. 12 and 13, the first connection line CL1 may be in the shape of a fold line and may include a first electrode connection part CE11 and a second electrode connection part CE22. The second electrode connection part C12 extends along the first direction, and an included angle between the first electrode connection part CE11 and the second electrode connection part CE22 is greater than 90 degrees and less than 180 degrees. One end of the first electrode connection part CE11 is connected to the control electrode T12 of the first transistor, the other end of the first electrode connection part CE11 is connected to one end of the second electrode connection part CE22, and the other end of the second electrode connection part CE22 is connected to the control electrode of the third transistor.

In an exemplary example, as shown in FIGS. 12 and 13, the control electrode T22 of the second transistor may be located at one side of the control electrode T12 of the first transistor close to the control electrode T72 of the seventh transistor.

In an exemplary example, as shown in FIGS. 12 and 13, the control electrode T22 of the second transistor may be in the shape of an "n", and an opening facing the control electrode T82 of the eighth transistor is provided in the control electrode T22 of the second transistor.

In an exemplary example, as shown in FIGS. 12 and 13, the control electrode T42 of the fourth transistor may be located at one side of the control electrode T32 of the third transistor close to the control electrode T72 of the seventh transistor.

In an exemplary example, as shown in FIGS. 12 and 13, the control electrode T42 of the fourth transistor may be in the shape of an "n", and an opening facing the control electrode T82 of the eighth transistor is provided in the control electrode T42 of the fourth transistor.

In an exemplary example, as shown in FIGS. 12 and 13, the control electrode T52 of the fifth transistor may be located at one side of the first plate C11 of the first capacitor away from the control electrode T82 of the eighth transistor.

In an exemplary example, as shown in FIGS. 12 and 13, the control electrode T52 of the fifth transistor may include a first connection segment T52A extending along the first direction and two first branch segments T52B extending along the second direction, the two first branch segments T52B being arranged along the first direction. One end of the first connection segment T52A is connected to one of the first branch segments, the other end of the first connection segment T52A is connected to the first plate C11 of the first capacitor, the other one of the first branch segments is connected to the middle portion of the first connection segment T52A, and the length of the first branch segment, connected to the middle portion of the first connection segment T52A, along the second direction is greater than the length of the first branch segment, connected to the end of the first connection segment T52A, along the second direction.

In an exemplary example, as shown in FIGS. 12 and 13, the second connection line CL2 is located at one side of the control electrode T52 of the fifth transistor close to the control electrode T12 of the first transistor. The second connection line CL2 is strip-shaped and extends along the first direction. The second connection line CL2 is connected to the first plate C11 of the first capacitor.

In an exemplary example, as shown in FIGS. 12 and 13, the control electrode T62 of the sixth transistor may be located at one side of the control electrode T82 of the eighth transistor away from the first plate C31 of the third capacitor. The control electrode T62 of the sixth transistor may be in the shape of an "n", and an opening facing away from the control electrode T82 of the eighth transistor is provided in the control electrode T62 of the sixth transistor.

In an exemplary example, as shown in FIGS. 12 and 13, the control electrode T72 of the seventh transistor may be located at one side of the control electrode T42 of the fourth transistor close to the first plate C11 of the first capacitor.

In an exemplary example, as shown in FIGS. 12 and 13, the control electrode T72 of the seventh transistor may be in the shape of a comb. The control electrode T72 of the seventh transistor may include a second connection segment T72A extending along the first direction and a plurality of second branch segments T72B extending along the second direction, the plurality of second branch segments being arranged along the first direction. One end of each of the second branch segments T72B is connected to the second connection segment T72A, the other end of at least one of the second branch segments T72B is connected to the first plate C21 of the second capacitor, and the length of the second branch segments, connected to the first plate C21 of the second capacitor, along the second direction is greater than the length of the second branch segments, not connected to the first plate C21 of the second capacitor, along the second direction. FIG. 12 and FIG. 13 are illustrated by taking six second branch segments, five of which are connected to the first plate C21 of the second capacitor, as an example, the present disclosure is not limited thereto.

In an exemplary example, as shown in FIGS. 12 and 13, the control electrode T82 of the eighth transistor may be located at one side of the control electrode T62 of the sixth transistor close to the first plate C31 of the third capacitor.

In an exemplary example, as shown in FIGS. 12 and 13, the control electrode T82 of the eighth transistor may be in the shape of a comb. The control electrode T82 of the eighth transistor may include a third connection segment T82A extending along the first direction and a plurality of third branch segments T82B extending along the second direction, the plurality of third branch segments being arranged along the first direction. One end of each of the third branch segments T82B is connected to the third connection segment T82A, the other end of at least one of the third branch segment T82B is connected to the first plate C31 of the third capacitor, and the length of the third branch segments, connected to the first plate C31 of the third capacitor, along the second direction is greater than the length of the third branch segments, not connected to the first plate C31 of the third capacitor, along the second direction.

FIG. 12 and FIG. 13 are illustrated by taking three third branch segments, one of which is connected to the first plate C31 of the third capacitor, as an example, the present disclosure is not limited thereto.

In an exemplary example, as shown in FIGS. 12 and 13, the control electrode T102 of the tenth transistor may be located at one side of the first plate C31 of the third capacitor away from the control electrode T82 of the eighth transistor. The control electrode T102 of the tenth transistor may be in the shape of an "n", and an opening facing away from the control electrode T72 of the seventh transistor is provided in the control electrode T102 of the tenth transistor.

In an exemplary example, as shown in FIGS. 12 and 13, the control electrode T12 of the first transistor is arranged across the active layer of the first transistor, the control electrode T22 of the second transistor is arranged across the active layer of the second transistor, the control electrode T32 of the third transistor is arranged across the active layer of the third transistor, the control electrode T42 of the fourth transistor is arranged across the active layer of the fourth transistor, the two first branch segments T52B of the control electrode T52 of the fifth transistor are arranged across the active layer of the fifth transistor, the control electrode T62 of the sixth transistor is arranged across the active layer of the first transistor, the plurality of second branch segments T72B of the control electrode T72 of the seventh transistor are arranged across the active layer of the seventh transistor, the plurality of third branch segments T82B of the control electrode T82 of the eighth transistor are arranged across the active layer of the eighth transistor, and the control electrode T102 of the tenth transistor is arranged across the active layer of the tenth transistor, that is, the extension direction of the control electrode of at least one of the transistors is perpendicular to the extension direction of its active layer.

In an exemplary example, this running of the processes further includes a metallization process. The metallization process includes, after the first conductive layer is formed, using a semiconductor layer in an area blocked by control electrodes of a plurality of transistors (i.e., an area where the semiconductor layer overlaps with the control electrodes) as channel regions of the transistors, and the semiconductor layer which is not blocked by the third conductive layer is processed to become a metallization layer to form electrode connection parts of the transistors. As shown in FIG. 12, the active connection line AL in the present disclosure is processed to become a metallization layer to form a metallized active connection line AL.

Figure 14:
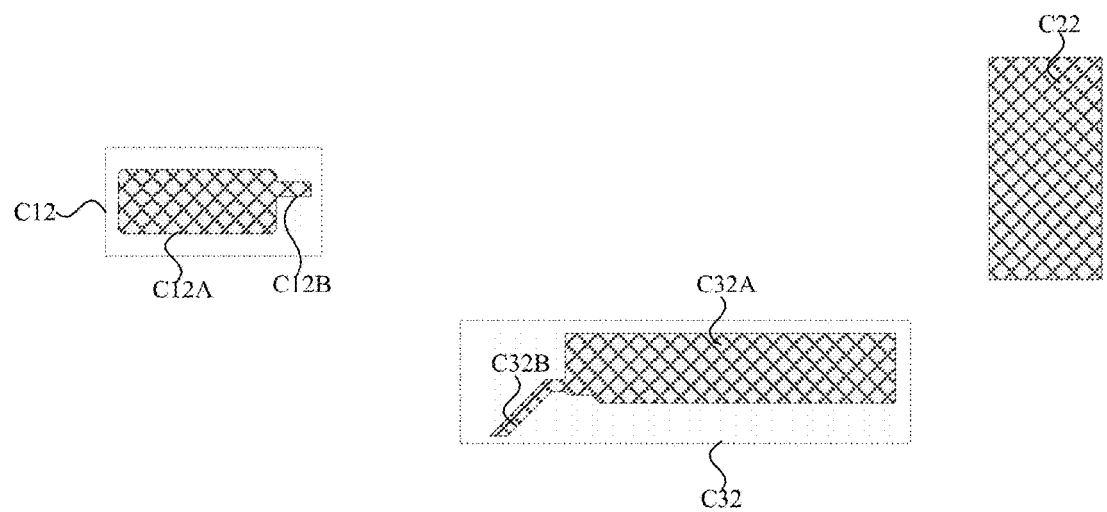
FIG. 14 is a schematic diagram of patterns of a second conductive layer.
Figure 15:
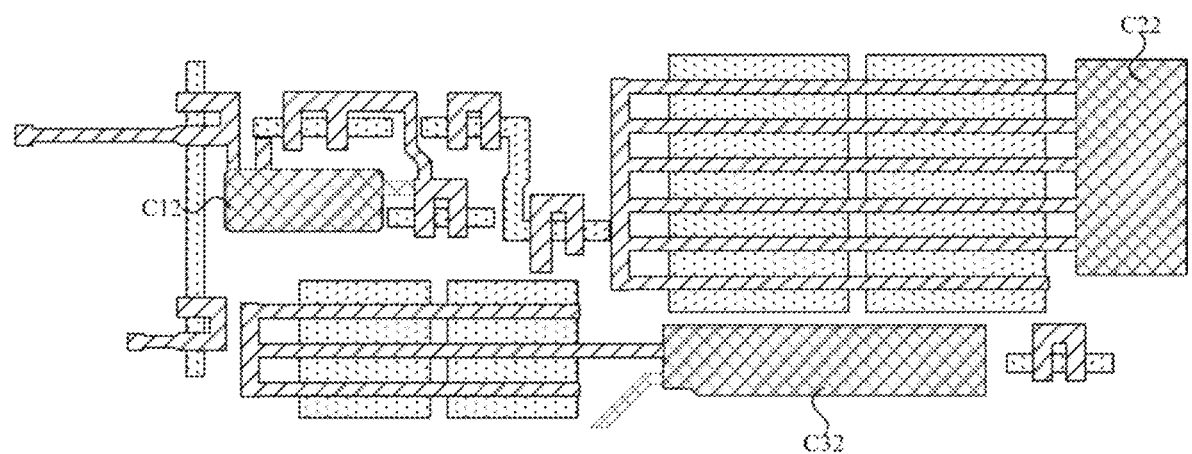
FIG. 15 is a schematic diagram of a second conductive layer after its patterns are formed.

(3) Forming patterns of a second conductive layer includes: depositing a second insulating film and a second conductive film on the substratum, on which the aforementioned patterns are formed, and patterning the second insulating film and the second conductive film through the patterning processes to form patterns of a second insulating layer and the patterns of the second conductive layer located on the patterns of the second insulating layer, as shown in FIGS. 14 and 15. FIG. 14 is a schematic diagram of the patterns of the second conductive layer, and FIG. 15 is a schematic diagram of the second conductive layer after its patterns are formed.

In an exemplary example, as shown in FIGS. 14 and 15, the patterns of the second conductive layer may include a second plate C12 of the first capacitor through a second plate C32 of the third capacitor, which are located in the gate driving circuit.

In an exemplary example, the second conductive film may be made of a metal material, such as any one or more of silver (Ag), copper (Cu), aluminum (Al), titanium (Ti) and molybdenum (Mo), or an alloy material of the aforementioned metals, such as aluminum neodymium alloy (AlNd) or molybdenum niobium alloy (MoNb), and may be a single-layered structure or a multi-layered composite structure, such as Ti/Al/Ti, etc.

In an exemplary example, the second insulating film may be made of any one or more of silicon oxide (SiOx), silicon nitride (SiNx) and silicon oxynitride (SiON), and may be a single-layer, multi-layers or a composite layer. The second insulating layer may be referred to as a second gate insulating layer.

In an exemplary example, as shown in FIGS. 14 and 15, a virtual straight line extending along the first direction passes through the second plate C12 of the first capacitor and the second plate C22 of the second capacitor. The second plate C32 of the third capacitor is located at one side of the second plate C12 of the first capacitor close to the second plate C22 of the second capacitor.

In an exemplary example, as shown in FIGS. 14 and 15, the second plate C12 of the first capacitor may include a first capacitor body part C12A and a first capacitor connection part C12B connected to each other. The first capacitor connection part C12B is located at one side of the first capacitor body part C12A close to the second plate C22 of the second capacitor.

In an exemplary example, as shown in FIGS. 14 and 15, the first capacitor body part C12A and the first capacitor connection part C12B may be strip-shaped and extend along the second direction.

In an exemplary example, as shown in FIGS. 14 and 15, an orthographic projection of the first capacitor body part C12A on the substratum overlaps at least partially with an orthographic projection of the first plate C11 of the first capacitor on the substratum, and there is no overlapping area between an orthographic projection of the first capacitor connection part C12B on the substratum and the orthographic projection of the first plate C11 of the first capacitor on the substratum.

In an exemplary example, as shown in FIGS. 14 and 15, the second plate C22 of the second capacitor may be strip-shaped and extend along the first direction.

In an exemplary example, as shown in FIGS. 14 and 15, the second plate C32 of the third capacitor may include a third capacitor body part C32A and a third capacitor connection part C32B connected to each other. The third capacitor connection part C32B is located at one side of the third capacitor body part C32A close to the second plate C12 of the first capacitor.

In an exemplary example, as shown in FIGS. 14 and 15, the third capacitor body part C32A may be strip-shaped and extend along the second direction. The third capacitor connection part C32B may be in the shape of a fold line.

In an exemplary example, as shown in FIGS. 14 and 15, an orthographic projection of the third capacitor body part C32A on the substratum overlaps at least partially with an orthographic projection of the first plate C31 of the third capacitor on the substratum, and there is no overlapping area between an orthographic projection of the third capacitor connection part C32B on the substratum and the orthographic projection of the first plate C31 of the third capacitor on the substratum.

Figure 16:
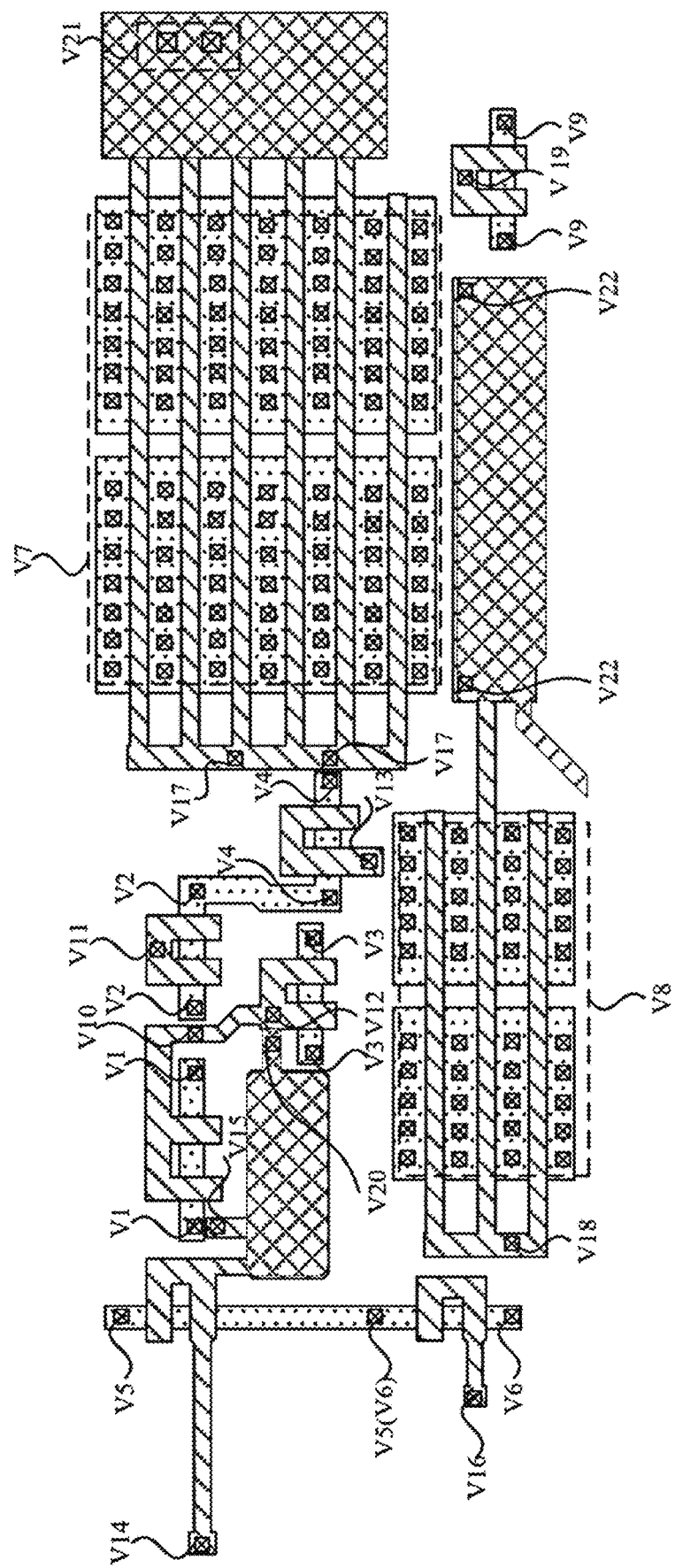
FIG. 16 is a schematic diagram of a third insulating layer after its patterns are formed.

(4) Forming patterns of a third insulating layer includes: depositing a third insulating film on the substratum, on which the aforementioned patterns are formed, and patterning the third insulating film through the patterning processes to form the patterns of the third insulating layer overlaying the aforementioned structures. A pattern of a plurality of via holes is provided in the third insulating layer, as shown in FIG. 16. FIG. 16 is a schematic diagram of the third insulating layer after its patterns are formed.

In an exemplary example, the pattern of the plurality of via holes may include first via holes V1 through a ninth via hole V9 provided in the first insulating layer, the second insulating layer and the third insulating layer, tenth via holes V10 through a nineteenth via hole V19 provided in the second insulating layer and the third insulating layer, and a twentieth via hole V20 through twenty-second via holes V22 provided in the third insulating layer.

In an exemplary example, the third insulating film may be made of any one or more of silicon oxide (SiOx), silicon nitride (SiNx) and silicon oxynitride (SiON), and may be a single-layer, multi-layers or a composite layer. The third insulating layer may be referred to as a second gate insulating layer.

As shown in FIG. 16, the first via holes V1 expose the active layer of the first transistor, the second via holes V2 expose the active layer of the second transistor, the third via holes V3 expose the active layer of the third transistor, the fourth via holes V4 expose the active layer of the fourth transistor, the fifth via holes V5 expose the active layer of the fifth transistor, the sixth via holes V6 exposes the active layer of the sixth transistor, the seventh via holes V7 expose the active layer of the seventh transistor, the eighth via holes V8 expose the active layer of the eighth transistor, the ninth via hole V9 exposes the active layer of the ninth transistor, the tenth via holes V10 expose the control electrode of the first transistor, the eleventh via hole V11 exposes the control electrode of the second transistor, the twelfth via hole V12 exposes the control electrode of the third transistor, the thirteenth via hole V13 exposes the control electrode of the fourth transistor, the fourteenth via hole V14 exposes the control electrode of the fifth transistor, the fifteenth via hole V15 exposes the second connection line, the sixteenth via hole V16 exposes the control electrode of the sixth transistor, the seventeenth via hole V17 exposes the control electrode of the seventh transistor, the eighteenth via hole V18 exposes the control electrode of the eighth transistor, the nineteenth via hole V19 exposes the control electrode of the tenth transistor, the twentieth via hole V20 exposes the first capacitor connection part of the second plate of the first capacitor, the twenty-first via holes V21 expose the second plate of the second capacitor, and the twenty-second via holes V22 expose the second plate of the third capacitor.

In an exemplary example, the number of each of the first via holes V1 through the sixth via holes V6 and the tenth via holes V10, which are separately configured to expose two electrode connection parts of the active layers of the transistors, is two, wherein one of the fifth via holes and one of the sixth via holes are the same via hole.

In an exemplary example, there is a plurality of seventh via holes V7, which is arranged in an array.

In an exemplary example, there is a plurality of eighth via holes V8, which is arranged in an array.

In an exemplary example, the fourteenth via hole V14 exposes the first branch segment of the control electrode of the fifth transistor, which is connected to the middle portion of the first connection segment.

In an exemplary example, there is a plurality of twenty-first via holes V21, which is arranged along the first direction.

In an exemplary example, the number of the twenty-second via holes V21 may be three, wherein two of the twenty-second via holes are configured to expose the third capacitor body part. The two of the twenty-second via holes exposing the third capacitor body part are arranged along the second direction. The remaining one of the twenty-second via holes is configured to expose the third capacitor connection part. Only two of the twenty-second via holes exposing the third capacitor body part are shown in FIG. 16.

Figure 17:
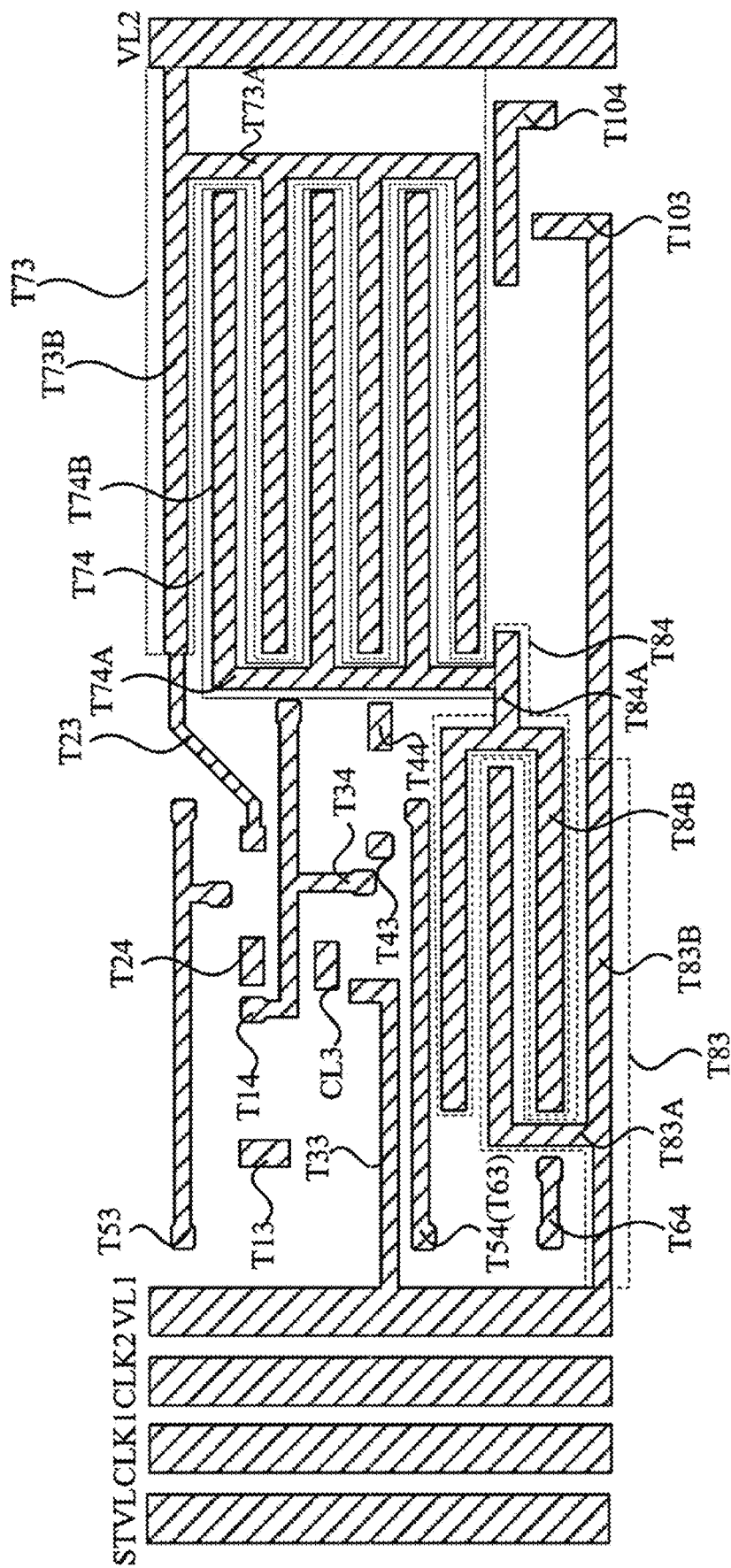
FIG. 17 is a schematic diagram of patterns of a third conductive layer.
Figure 18:
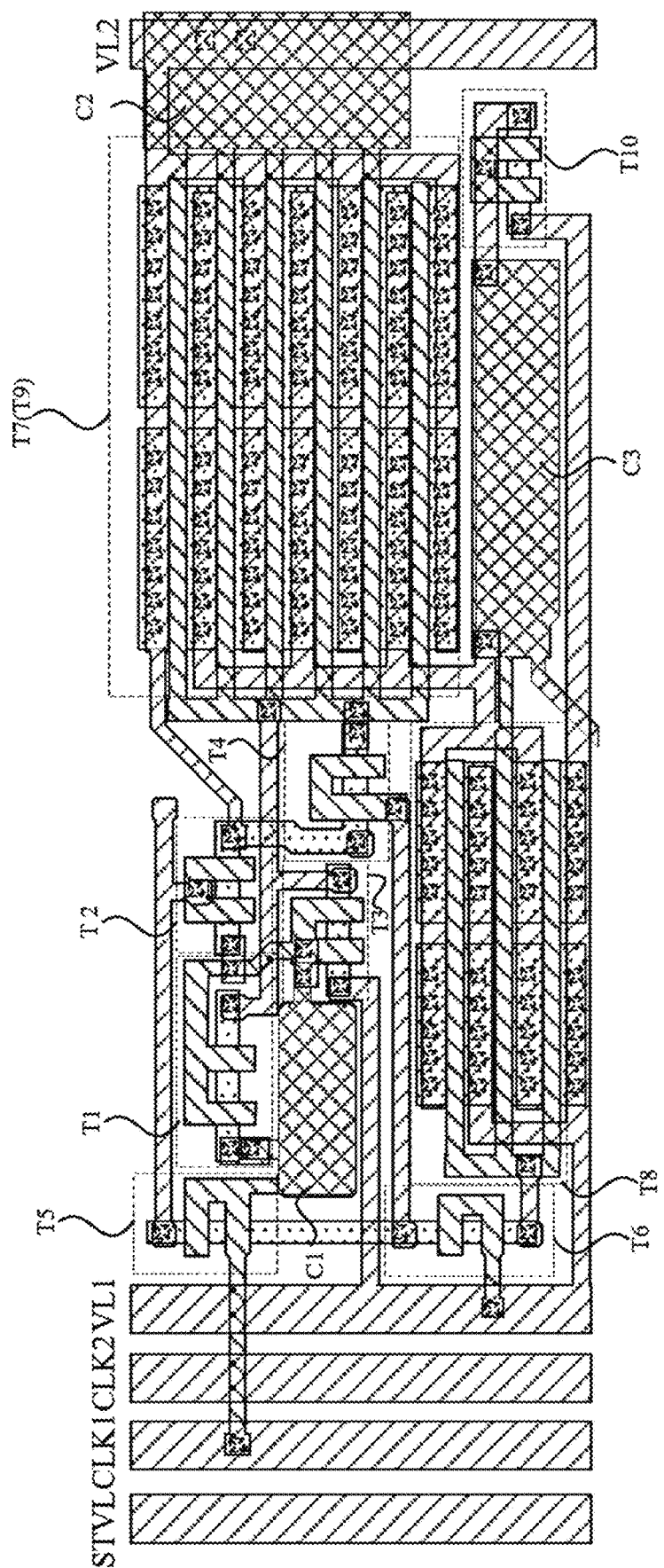
FIG. 18 is a schematic diagram of a third conductive layer after its patterns are formed.

(5) Forming patterns of a third conductive layer includes: depositing a third metal film on the substratum, on which the aforementioned patterns are formed, and patterning the third metal film through the patterning processes to form the patterns of the third metal layer, as shown in FIGS. 17 and 18. FIG. 17 is a schematic diagram of the patterns of the third conductive layer, and FIG. 18 is a schematic diagram of the third conductive layer after its patterns are formed.

In an exemplary example, as shown in FIGS. 17 and 18, the patterns of the third conductive layer may include an initial signal line STVL, a first clock signal line CLK1, a second clock signal line CLK2, a first power supply line VL1, a second power supply line VL2, a first electrode T13 and a second electrode T14 of the first transistor through a first electrode T83 and a second electrode T84 of the eighth transistor and a first electrode T103 and a second electrode T104 of the tenth transistor, which are located in the gate driving circuit.

In some examples, the third conductive film may be made of a metal material, such as any one or more of silver (Ag), copper (Cu), aluminum (Al), titanium (Ti) and molybdenum (Mo), or an alloy material of the aforementioned metals, such as aluminum neodymium alloy (AlNd) or molybdenum niobium alloy (MoNb), and may be a single-layered structure or a multi-layered composite structure, such as Ti/Al/Ti, etc.

In an exemplary example, as shown in FIGS. 17 and 18, the second electrode T14 of the first transistor and the second electrode T34 of the third transistor form an integrated structure. The second electrode T54 of the fifth transistor and the first electrode T63 of the sixth transistor form an integrated structure. The second electrode T74 of the seventh transistor and the second electrode T84 of the eighth transistor form an integrated structure. The first power supply line VL1, the first electrode T33 of the third transistor, the first electrode T83 of the eighth transistor and the first electrode T103 of the tenth transistor form an integrated structure. The second power supply line VL2, the first electrode T73 of the seventh transistor and the second electrode T24 of the second transistor form an integrated structure.

In an exemplary example, as shown in FIGS. 17 and 18, the initial signal line STVL is located at one side of the first capacitor away from the second capacitor, the first clock signal line CLK1 is located at one side of the initial signal line STVL close to the first capacitor C1, the second clock signal line CLK2 is located at one side of the first clock signal line CLK1 close to the first capacitor C1, the first power supply line VL1 is located at one side of the second clock signal line CLK2 close to the first capacitor C1, and the second power supply line VL2 is located at one side of the seventh transistor away from the first capacitor CL.

In an exemplary example, an orthographic projection of the first power supply line VL1 on the substratum overlaps at least partially with orthographic projections of the control electrode of the fifth transistor and the control electrode of the sixth transistor on the substratum.

In an exemplary example, as shown in FIGS. 17 and 18, an orthographic projection of the second power supply line VL2 on the substratum overlaps at least partially with an orthographic projection of the second plate of the second capacitor on the substratum.

In an exemplary example, the first electrode T53 of the fifth transistor of the first stage shift register is electrically connected to the initial signal line.

In an exemplary example, an orthographic projection of the first electrode T53 of the fifth transistor on the substratum overlaps partially with an orthographic projection of the third capacitor connection part of the shift register at the previous stage on the substratum, and is connected to the third capacitor connection part of the shift register at the previous stage through the twenty-second via hole that exposes the third capacitor connection part.

In an exemplary example, as shown in FIGS. 17 and 18, the first electrode T13 of the first transistor may be in the shape of a square and extend along the first direction. An orthographic projection of the first electrode T13 of the first transistor on the substratum overlaps at least partially with an orthographic projection of the second connection line on the substratum.

In an exemplary example, as shown in FIGS. 17 and 18, the second electrode T14 of the first transistor may be in the shape of an "L", and an opening facing the second electrode T24 of the second transistor is provided in the second electrode T14 of the first transistor. An orthographic projection of the second electrode T14 of the first transistor on the substratum overlaps partially with an orthographic projection portion of the active connection line on the substratum.

In an exemplary example, as shown in FIGS. 17 and 18, the first electrode T23 of the second transistor may be in the shape of a fold line and be connected to the first electrode T73 of the seventh transistor. The second electrode T24 of the second transistor may be strip-shaped and extend along the second direction.

In an exemplary example, as shown in FIGS. 17 and 18, the first electrode T33 of the third transistor may be in the shape of an "L", and an opening facing the first electrode T13 of the first transistor is provided in the first electrode T33 of the third transistor. The second electrode T34 of the third transistor may be in the shape of a square and extend along the first direction.

In an exemplary example, as shown in FIGS. 17 and 18, the first plate T43 of the first capacitor may be in the shape of a lump. The second electrode T44 of the fourth transistor may be strip-shaped and extend along the second direction. An orthographic projection of the second electrode T44 of the fourth transistor on the substratum overlaps at least partially with an orthographic projection of the third connection segment of the first electrode of the seventh transistor on the substratum.

In an exemplary example, as shown in FIGS. 17 and 18, the first electrode T53 of the fifth transistor may be in the shape of the Chinese character "T". The integrated structure of the second electrode T54 of the fifth transistor and the first electrode T63 of the sixth transistor may be strip-shaped and extend along the second direction.

In an exemplary example, as shown in FIGS. 17 and 18, the second electrode T64 of the sixth transistor may be in the shape of a dumbbell and extend along the second direction.

In an exemplary example, as shown in FIGS. 17 and 18, the first electrode T73 of the seventh transistor may be in the shape of a comb, and may include a fourth connection segment T73A extending along the first direction and a plurality of fourth branch segments T73B extending along the second direction, the plurality of fourth branch segments T73B being arranged along the first direction. Each of the fourth branch segments T73B is connected to the fourth connection segment T73A, and one of the fourth branch segments is also connected to the first electrode T23 of the second transistor and the second power supply line VL2, respectively. The length of the fourth branch segment, connected to the first electrode T23 of the second transistor and the second power supply line VL2, along the second direction is greater than the length of other fourth branch segments along the second direction. FIGS. 17 and 18 are illustrated by taking four branch segments as an example.

In an exemplary example, as shown in FIGS. 17 and 18, the second electrode T74 of the seventh transistor may be in the shape of a comb, and may include a fifth connection segment T74A extending along the first direction and a plurality of fifth branch segments T74B extending along the second direction, the plurality of fifth branch segments T74B being arranged along the first direction. Each of the fifth branch segments T74B is connected to the fifth connection segment T74A, and the fifth connection segment T74A is connected to the second electrode of the eighth transistor. FIGS. 17 and 18 are illustrated by taking three fifth branch segments as an example.

In an exemplary example, the plurality of fourth branch segments T73B and the plurality of fifth branch segments T74B are arranged along the first direction and arranged alternately, i.e., a fourth branch segment is arranged between two adjacent fifth branch segments and a fifth branch segment is arranged between two adjacent fourth branch segments.

In an exemplary example, as shown in FIGS. 17 and 18, the first electrode T83 of the eighth transistor may be in the shape of a comb, and may include a sixth connection segment T83A extending along the first direction and a plurality of sixth branch segments T83B extending along the second direction, the plurality of sixth branch segments T83B being arranged along the first direction. Each of the sixth branch segments T83B is connected to the sixth connection segment T83A, and one of the sixth branch segments is also connected to the first electrode T103 of the tenth transistor and the first power supply line VL1, respectively. The length of the sixth branch segment, connected to the first electrode T103 of the tenth transistor and the first power supply line VL1, along the second direction is greater than the length of other sixth branch segments along the second direction.

In an exemplary example, as shown in FIGS. 17 and 18, the second electrode T84 of the eighth transistor may be in the shape of a comb structure, and may include a seventh connection segment T84A and a plurality of seventh branch segments T84B extending along the second direction, the plurality of seventh branch segments T84B being strip-shaped and being arranged along the first direction. The seventh connection segment T84A may in the shape of the Chinese character "T", each of the seventh branch segments T84B is connected to the seventh connection segment T84A, and the seventh connection segment T84A is connected to the fourth connection segment T74A.

In an exemplary example, an orthographic projection of the seventh branch segment T84B on the substratum overlaps at least partially with the orthographic projection of the third capacitor body part on the substratum.

In an exemplary example, as shown in FIGS. 17 and 18, the plurality of sixth branch segments T83B and the plurality of seventh branch segments T84B are arranged along the first direction and arranged alternately, i.e., a sixth branch segment is arranged between two adjacent seventh branch segments and a seventh branch segment is arranged between two adjacent sixth branch segments.

In an exemplary example, as shown in FIGS. 17 and 18, the first electrode T103 of the tenth transistor may be in the shape of an "L", and an opening facing the third capacitor is provided in the first electrode T103 of the tenth transistor. An orthographic projection of the first electrode T103 of the tenth transistor on the substratum overlaps at least partially with the orthographic projection of the third capacitor connection part on the substratum.

In an exemplary example, as shown in FIGS. 17 and 18, the second electrode T104 of the tenth transistor may be in the shape of an "L", and an opening facing the first electrode T103 of the tenth transistor is provided in the second electrode T104 of the tenth transistor. An orthographic projection of the second electrode T104 of the tenth transistor on the substratum overlaps at least partially with orthographic projections of the control electrode of the tenth transistor and the third capacitor body part on the substratum.

In an exemplary example, as shown in FIGS. 17 and 18, the first electrode T13 and the second electrode T14 of the first transistor are electrically connected to the active layer of the first transistor through the first via holes, and the first electrode T13 of the first transistor is electrically connected to the second connection line through the fifteenth via hole. The integrated structure of the second electrode T14 of the first transistor and the second electrode T34 of the third transistor is electrically connected to the control electrode of the seventh transistor through the seventeenth via hole. The first electrode T23 and the second electrode T24 of the second transistor are electrically connected to the active layer of the second transistor through the second via holes, and the second electrode T24 of the second transistor is electrically connected to the control electrode of the first transistor through the tenth via holes. The first electrode T33 and the second electrode T34 of the third transistor are electrically connected to the active layer of the third transistor through the third via holes. The first electrode T43 and the second electrode T44 of the fourth transistor are connected to the active layer of the fourth transistor through the fourth via holes, and the second electrode T44 of the fourth transistor is electrically connected to the control electrode of the seventh transistor through the seventeenth via hole. The first electrode T53 and the second electrode T54 of the fifth transistor are connected to the first electrode of the fifth transistor through the fifth via holes, and the first electrode T53 of the fifth transistor is electrically connected to the control electrode of the second transistor through the eleventh via hole. The first electrode T63 and the second electrode T64 of the sixth transistor are electrically connected to the active layer of the sixth transistor through the sixth via holes, the integrated structure of the second electrode T54 of the fifth transistor and the first electrode T63 of the sixth transistor is electrically connected to the control electrode of the fourth transistor through the thirteenth via hole, and the second electrode T64 of the sixth transistor is electrically connected to the control electrode of the eighth transistor through the eighteenth via hole. The first electrode T73 and the second electrode T74 of the seventh transistor are electrically connected to the active layer of the seventh transistor through the seventh via holes. The first electrode T83 and the second electrode T84 of the eighth transistor are electrically connected to the active layer of the eighth transistor through the eighth via holes, and the integrated structure of the second electrode T74 of the seventh transistor and the second electrode T84 of the eighth transistor is electrically connected to the second plate of the third capacitor through the twenty-second via holes. The first electrode T103 and the second electrode T104 of the tenth transistor are electrically connected to the active layer of the tenth transistor through the ninth via hole, and the second electrode T104 of the tenth transistor is connected to the control electrode of the tenth transistor through the nineteenth via hole and connected to the second plate of the third capacitor of the twenty-second via holes. The third connection line CL3 is electrically connected to the control electrode of the third transistor through the twelfth via hole, and is electrically connected to the first capacitor connection part of the second plate of the first capacitor through the twentieth via hole. The first power supply line VL1 is connected to the control electrode of the sixth transistor through the sixteenth via hole, the second power supply line VL2 is electrically connected to the second plate of the second capacitor through the twenty-first via holes, and the clock signal line, to which the shift register where the fifth transistor is located is connected, electrically connected to the control electrode of the fifth transistor through the fourteenth via hole.

In an exemplary example, as shown in FIGS. 17 and 18, the second electrode T44 of the fourth transistor is electrically connected to the first electrode T23 of the second transistor through the metallized active connection line.

In an exemplary example, as shown in FIGS. 17 and 18, the first electrode T13 of the first transistor is electrically connected to the first plate of the first capacitor and the control electrode of the fifth transistor through the second connection line.

In an exemplary example, when the shift register is the shift register provided in FIG. 7, that is, the shift register further includes the ninth transistor, the seventh transistor in FIGS. 10 to 18 is reused as the ninth transistor. The active layer of the seventh transistor is reused as the active layer of the ninth transistor, the control electrode of the seventh transistor is reused as the control electrode of the ninth transistor, the first electrode of the seventh transistor is reused as the first electrode of the ninth transistor, and the second electrode of the seventh transistor is reused as the second electrode of the ninth transistor.

The example of the present disclosure further provides a display device, which may include a display substrate.

The display substrate is the display substrate in accordance with any one of the foregoing examples, and its implementation principle and implementation effect are similar to the foresaid implementation principle and implementation effect and will not be repeated herein.

In an exemplary example, the display device may be a liquid crystal display (LCD) or an organic light emitting diode (OLED) display device. The display device may be any product or component with a display function, such as a liquid crystal panel, electronic paper, an OLED panel, an active-matrix organic light emitting diode (AMOLED) panel, a mobile phone, a tablet computer, a television, a display, a notebook computer, a digital photo frame or a navigator.

The example of the present disclosure further provides a driving method of a shift register, which is used for driving the shift register. The method includes the following steps.

In step 100, a first control sub-circuit provides a signal of a third power supply terminal or a clock signal terminal to a first node and a third node under the control of a signal input terminal, the clock signal terminal and a second node.

In step 200, a pull-up control sub-circuit provides a signal of a second power supply terminal to the first node under the control of the third node.

In step 300, a second control sub-circuit provides a signal of the signal input terminal to the second node and a fourth node under the control of the clock signal terminal and the first power supply terminal.

In step 400, the output control sub-circuit provides a signal of the first power supply terminal or the signal of the third power supply terminal to the signal output terminal under the control of the first node and the fourth node.

The shift register is the shift register in accordance with any one of the foregoing examples, and its implementation principle and implementation effect are similar to the foresaid implementation principle and implementation effect and will not be repeated herein.

The drawings in the examples of the present disclosure relate only to the structures involved in the examples of the present disclosure, and other structures may be described with reference to conventional designs.

For the sake of clarity, the thickness and size of a layer or a micro structure is enlarged in the drawings used to describe the examples of the present disclosure. It can be understood that when an element such as a layer, film, region or substrate is described as being "on" or "under" another element, this element may be "directly" located "on" or "under" the other element, or an intermediate element may exist.

Although the embodiments disclosed in the present disclosure are described as above, the described contents are only embodiments which are adopted in order to facilitate understanding of the present invention, and are not intended to limit the present disclosure. Any skilled person in the art to which the present invention pertains can make any modifications or alterations in forms and details of implementation without departing from the spirit and scope of the present invention. However, the patent protection scope of the present invention should be subject to the scope defined by the appended claims.

The invention claimed is:

1. A shift register comprising a first control sub-circuit, a second control sub-circuit, a pull-up control sub-circuit and an output control sub-circuit, wherein the shift register is electrically connected to a signal input terminal, a signal output terminal, a clock signal terminal and a first power supply terminal through a third power supply terminal;
   the first control sub-circuit, electrically connected to the signal input terminal, the clock signal terminal, the third power supply terminal, a first node, a second node and a third node respectively, is configured to provide a signal of the third power supply terminal or the clock signal terminal to the first node and the third node under the control of the signal input terminal, the clock signal terminal and the second node;
   the pull-up control sub-circuit, electrically connected to the second power supply terminal, the first node and the third node respectively, is configured to provide a signal of the second power supply terminal to the first node under the control of the third node;
   the second control sub-circuit, electrically connected to the clock signal terminal, the signal input terminal, the first power supply terminal, the second node and a fourth node respectively, is configured to provide a signal of the signal input terminal to the second node and the fourth node under the control of the clock signal terminal and the first power supply terminal; and
   the output control sub-circuit, electrically connected to the signal output terminal, the first power supply terminal, the third power supply terminal, the first node and the fourth node respectively, is configured to provide a signal of the first power supply terminal or the signal of the third power supply terminal to the signal output terminal under the control of the first node and the fourth node.

2. The shift register according to claim 1, wherein the first power supply terminal and the second power supply terminal are the same signal terminal; and
   a voltage value of the signal of the first power supply terminal and a voltage value of the signal of the second power supply terminal are greater than a voltage value of the signal of the third power supply terminal.

3. The shift register according to claim 1, wherein the first control sub-circuit comprises a first transistor, a second transistor, a fourth transistor and a first capacitor, the first capacitor comprising a first plate and a second plate;
   a control electrode of the first transistor is electrically connected to the third node, a first electrode of the first transistor is electrically connected to the clock signal terminal, and a second electrode of the first transistor is electrically connected to the first node;
   a control electrode of the second transistor is electrically connected to the signal input terminal, a first electrode of the second transistor is electrically connected to the third power supply terminal, and a second electrode of the second transistor is electrically connected to the third node;
   a control electrode of the fourth transistor is electrically connected to the second node, a first electrode of the fourth transistor is electrically connected to the third power supply terminal, and a second electrode of the fourth transistor is electrically connected to the first node; and
   the first plate of the first capacitor is electrically connected to the clock signal terminal, and the second plate of the first capacitor is electrically connected to the third node.

4. The shift register according to claim 1, wherein the pull-up control sub-circuit comprises a third transistor; and
   a control electrode of the third transistor is electrically connected to the third node, a first electrode of the third transistor is electrically connected to the second power supply terminal, and a second electrode of the third transistor is electrically connected to the first node.

5. The shift register according to claim 1, wherein the second control sub-circuit comprises a fifth transistor and a sixth transistor;
   a control electrode of the fifth transistor is electrically connected to the clock signal terminal, a first electrode of the fifth transistor is electrically connected to the signal input terminal, and a second electrode of the fifth transistor is electrically connected to the second node; and
   a control electrode of the sixth transistor is electrically connected to the first power supply terminal, a first electrode of the sixth transistor is electrically connected to the second node, and a second electrode of the sixth transistor is electrically connected to the fourth node.

6. The shift register according to claim 1, wherein the output control sub-circuit comprises a seventh transistor, an eighth transistor, a ninth transistor, a tenth transistor, a second capacitor and a third capacitor, the second capacitor and the third capacitor each comprising a first plate and a second plate;
   a control electrode of the seventh transistor is electrically connected to the first node, a first electrode of the seventh transistor is electrically connected to the third power supply terminal, and a second electrode of the seventh transistor is electrically connected to the signal output terminal;
   a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode of the ninth transistor is electrically connected to the first node, a first electrode of the ninth transistor is electrically connected to the third power supply terminal, and a second electrode of the ninth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the second capacitor is electrically connected to the first node, and the second plate of the second capacitor is electrically connected to the third power supply terminal; and the first plate of the third capacitor is electrically connected to the fourth node, and the second plate of the third capacitor is electrically connected to the signal output terminal.

7. The shift register according to claim 1, wherein the output control sub-circuit comprises a seventh transistor, an eighth transistor, a tenth transistor, a second capacitor and a third capacitor, the second capacitor and the third capacitor each comprising a first plate and a second plate;

a control electrode of the seventh transistor is electrically connected to the first node, a first electrode of the seventh transistor is electrically connected to the third power supply terminal, and a second electrode of the seventh transistor is electrically connected to the signal output terminal;

a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the second capacitor is electrically connected to the first node, and the second plater of the second capacitor is electrically connected to the third power supply terminal; and the first plate of the third capacitor is electrically connected to the fourth node, and the second plate of the third capacitor is electrically connected to the signal output terminal.

8. The shift register according to claim 1, wherein the first control sub-circuit comprises a first transistor, a second transistor, a fourth transistor and a first capacitor, the second control sub-circuit comprises a fifth transistor and a sixth transistor, the pull-up control sub-circuit comprises a third transistor, and the output control sub-circuit comprises a seventh transistor, an eighth transistor, a ninth transistor, a tenth transistor, a second capacitor and a third capacitor, the first capacitor through the third capacitor each comprising a first plate and a second plate;

a control electrode of the first transistor is electrically connected to the third node, a first electrode of the first transistor is electrically connected to the clock signal terminal, and a second electrode of the first transistor is electrically connected to the first node;

a control electrode of the second transistor is electrically connected to the signal input terminal, a first electrode of the second transistor is electrically connected to the third power supply terminal, and a second electrode of the second transistor is electrically connected to the third node;

a control electrode of the third transistor is electrically connected to the third node, a first electrode of the third transistor is electrically connected to the second power supply terminal, and a second electrode of the third transistor is electrically connected to the first node;

a control electrode of the fourth transistor is electrically connected to the second node, a first electrode of the fourth transistor is electrically connected to the third power supply terminal, and a second electrode of the fourth transistor is electrically connected to the first node;

a control electrode of the fifth transistor is electrically connected to the clock signal terminal, a first electrode of the fifth transistor is electrically connected to the signal input terminal, and a second electrode of the fifth transistor is electrically connected to the second node;

a control electrode of the sixth transistor is electrically connected to the first power supply terminal, a first electrode of the sixth transistor is electrically connected to the second node, and a second electrode of the sixth transistor is electrically connected to the fourth node;

a control electrode of the seventh transistor is electrically connected to the first node, a first electrode of the seventh transistor is electrically connected to the third power supply terminal, and a second electrode of the seventh transistor is electrically connected to the signal output terminal;

a control electrode of the eighth transistor is electrically connected to the fourth node, a first electrode of the eighth transistor is electrically connected to the first power supply terminal, and a second electrode of the eighth transistor is electrically connected to the signal output terminal;

a control electrode of the ninth transistor is electrically connected to the first node, a first electrode of the ninth transistor is electrically connected to the third power supply terminal, and a second electrode of the ninth transistor is electrically connected to the signal output terminal;

a control electrode and a second electrode of the tenth transistor are electrically connected to the signal output terminal, and a first electrode of the tenth transistor is electrically connected to the first power supply terminal;

the first plate of the first capacitor is electrically connected to the clock signal terminal, and the second plate of the first capacitor is electrically connected to the third node;

the first plate of the second capacitor is electrically connected to the first node, and the second plate of the second capacitor is electrically connected to the third power supply terminal;

the first plate of the third capacitor is electrically connected to the fourth node, and the second plate of the third capacitor is electrically connected to the signal output terminal; and the first transistor through the tenth transistor are oxide transistors and are of N-type.

9. The shift register according to claim 1, wherein the first control sub-circuit comprises a first transistor, a second transistor, a fourth transistor and a first capacitor, the second control sub-circuit comprises a fifth transistor and a sixth transistor, the pull-up control sub-circuit comprises a third transistor, and the output control sub-circuit comprises a seventh transistor, an eighth transistor, a tenth transistor, a second capacitor and a third capacitor, the first capacitor through the third capacitor each comprising a first plate and a second plate;

- a control electrode of the first transistor is electrically connected to the third node, a first electrode of the first transistor is electrically connected to the clock signal terminal, and a second electrode of the first transistor is electrically connected to the first node;
- a control electrode of the second transistor is electrically connected to the signal input terminal, a first electrode of the second transistor is electrically connected to the third power supply terminal, and a second electrode of the second transistor is electrically connected to the third node;
- a control electrode of the third transistor is electrically connected to the third node, a first electrode of the third transistor is electrically connected to the second power supply terminal, and a second electrode of the third transistor is electrically connected to the first node;
- a control electrode of the fourth transistor is electrically connected to the second node, a first electrode of the fourth transistor is electrically connected to the third power supply terminal, and a second electrode of the fourth transistor is electrically connected to the first node;
- a control electrode of the fifth transistor is electrically connected to the clock signal terminal, a first electrode of the fifth transistor is electrically connected to the signal input terminal, and a second electrode of the fifth transistor is electrically connected to the second node;
- a control electrode of the sixth transistor is electrically connected to the first power supply terminal, a first electrode of the sixth transistor is electrically connected to the second node, and a second electrode of the sixth transistor is electrically connected to the fourth node;
- a control electrode of the seventh transistor is electrically connected to the first node, a first electrode of the seventh transistor is electrically connected to the third power supply terminal, and a second electrode of the seventh transistor is electrically connected to the signal output terminal;
- a control electrode of the eighth transistor is electrically connected to the fourth node, a first electrode of the eighth transistor is electrically connected to the first power supply terminal, and a second electrode of the eighth transistor is electrically connected to the signal output terminal;
- a control electrode and a second electrode of the tenth transistor are electrically connected to the signal output terminal, and a first electrode of the tenth transistor is electrically connected to the first power supply terminal;
- the first plate of the first capacitor is electrically connected to the clock signal terminal, and the second plate of the first capacitor is electrically connected to the third node;
- the first plate of the second capacitor is electrically connected to the first node, and the second plate of the second capacitor is electrically connected to the third power supply terminal;
- the first plate of the third capacitor is electrically connected to the fourth node, and the second plate of the third capacitor is electrically connected to the signal output terminal; and
- the first transistor through the eighth transistor and the tenth transistor are oxide transistors and are of N-type.

10. A driving method of a shift register, which is used for driving the shift register according to claim 1, the method comprising:

- a first control sub-circuit providing a signal of a third power supply terminal or a clock signal terminal to a first node and a third node under the control of a signal input terminal, the clock signal terminal and a second node;
- a pull-up control sub-circuit providing a signal of a second power supply terminal to the first node under the control of the third node;
- a second control sub-circuit providing a signal of the signal input terminal to the second node and a fourth node under the control of the clock signal terminal and a first power supply terminal; and
- the output control sub-circuit providing a signal of the first power supply terminal or the signal of the third power supply terminal to the signal output terminal under the control of the first node and the fourth node.

11. A display substrate comprising a substratum and a circuit structure layer disposed on the substratum, wherein the circuit structure layer comprises a gate driving circuit, which comprises a plurality of cascaded shift registers;

- a signal output terminal of an i-th stage shift register is electrically connected to a signal input terminal of an (i+1)-th stage shift register, 1≤i≤M−1 and M being the total number of stages of the shift registers;
- each of the shift registers comprises a first control sub-circuit, a second control sub-circuit, a pull-up control sub-circuit and an output control sub-circuit;
- the first control sub-circuit, electrically connected to a signal input terminal, a clock signal terminal, a third power supply terminal, a first node, a second node and a third node respectively, is configured to provide a signal of the third power supply terminal or the clock signal terminal to the first node and the third node under the control of the signal input terminal, the clock signal terminal and the second node;
- the pull-up control sub-circuit, electrically connected to a second power supply terminal, the first node and the third node respectively, is configured to provide a signal of the second power supply terminal to the first node under the control of the third node;
- the second control sub-circuit, electrically connected to the clock signal terminal, the signal input terminal, a first power supply terminal, the second node and a fourth node respectively, is configured to provide a signal of the signal input terminal to the second node and the fourth node under the control of the clock signal terminal and the first power supply terminal; and
- the output control sub-circuit, electrically connected to the signal output terminal, the first power supply terminal, the third power supply terminal, the first node and the fourth node respectively, is configured to provide a signal of the first power supply terminal or the signal of the third power supply terminal to the signal output terminal under the control of the first node and the fourth node.

12. The display substrate according to claim 11, further comprising an initial signal line, a first clock signal line, a second clock signal line, a first power supply line and a second power supply line extending along a first direction, the initial signal line, the first clock signal line, the second clock signal line, the first power supply line and the second power supply line being arranged along a second direction, and the first direction intersecting the second direction; and
   a signal input terminal of a first stage shift register is electrically connected to the initial signal line, first power supply terminals and second power supply terminals of all the shift registers are electrically connected to the first power supply line, third power supply terminals of all the shift registers are electrically connected to the second power supply line, a clock signal terminal of the i-th stage shift register is electrically connected to one of the first clock signal line and the second clock signal line, and a clock signal terminal of the (i+1)-th stage shift register is electrically connected to the other one of the first clock signal line and the second clock signal line.

13. The display substrate according to claim 12, wherein the circuit structure layer comprises a semiconductor layer, a first insulating layer, a first conductive layer, a second insulating layer, a second conductive layer, a third insulating layer and a third conductive layer which are sequentially stacked on the substratum, wherein
   the semiconductor layer comprises active layers of all transistors located in the gate driving circuit;
   the first conductive layer comprises control electrodes of all the transistors and a first plate of a first capacitor through a first plate of a third capacitor, which are located in the gate driving circuit;
   the second conductive layer comprises a second plate of the first capacitor through a second plate of the third capacitor, which are located in the gate driving circuit; and
   the third conductive layer comprises the initial signal line, the first clock signal line, the second clock signal line, the first power supply line, the second power supply line and first and second electrodes of all the transistors located in the gate driving circuit.

14. The display substrate according to claim 13, wherein the shift register comprises a first through eighth transistor and a tenth transistor, the third transistor being located between the first capacitor and the fourth transistor;
   a virtual straight line extending along the second direction passes through the active layer of the third transistor and the first plate of the first capacitor; and
   a virtual straight line extending along the second direction passes through the first plate of the first capacitor, the control electrode of the third transistor and the control electrode of the fourth transistor.

15. The display substrate according to claim 13, wherein the semiconductor layer further comprises an active connection line configured to connect the active layer of the second transistor with the active layer of the fourth transistor; and
   an orthographic projection of the second electrode of the first transistor on the substratum overlaps at least partially with an orthographic projection of the active connection line on the substratum.

16. The display substrate according to claim 13, wherein the first conductive layer further comprises a first connection line and a second connection line; and
   the control electrode of the first transistor, the control electrode of the third transistor and the first connection line form an integrated structure, and the control electrode of the first transistor and the control electrode of the third transistor are located at both sides of the first connection line respectively, the first plate of the first capacitor, the control electrode of the fifth transistor and the second connection line form an integrated structure, and the control electrode of the fifth transistor and the second connection line are located at the same side of the first plate of the first capacitor;
   wherein an orthographic projection of the first electrode of the first transistor on the substratum overlaps at least partially with an orthographic projection of the second connection line on the substratum; and
   an orthographic projection of the second electrode of the first transistor on the substratum overlaps at least partially with an orthographic projection of the first connection line on the substratum.

17. The display substrate according to claim 13, wherein the second plate of the first capacitor comprises a first capacitor body part and a first capacitor connection part connected to each other, the first capacitor connection part being located at one side of the first capacitor body part close to the second plate of the second capacitor;
   an orthographic projection of the first capacitor body part on the substratum overlaps at least partially with an orthographic projection of the first plate of the first capacitor on the substratum, and there is no overlapping area between an orthographic projection of the first capacitor connection part on the substratum and the orthographic projection of the first plate of the first capacitor on the substratum;
   the second plate of the third capacitor comprises a third capacitor body part and a third capacitor connection part connected to each other, the third capacitor connection part being located at one side of the third capacitor body part close to the second plate of the first capacitor;
   an orthographic projection of the third capacitor body part on the substratum overlaps at least partially with an orthographic projection of the first plate of the third capacitor on the substratum, and there is no overlapping area between an orthographic projection of the third capacitor connection part on the substratum and the orthographic projection of the first plate of the third capacitor on the substratum; and
   the initial signal line is located at one side of the first capacitor away from the second capacitor, the first clock signal line is located at one side of the initial signal line close to the first capacitor, the second clock signal line is located at one side of the first clock signal line close to the first capacitor, the first power supply line is located at one side of the second clock signal line close to the first capacitor, and the second power supply line is located at one side of the seventh transistor away from the first capacitor.

18. The display substrate according to claim 17, wherein the third conductive layer further comprises a third connection line, and an orthographic projection of the third connection line on the substratum overlaps at least partially with orthographic projections of the first capacitor connection part and the control electrode of the third transistor on the substratum, and the third connection line is electrically connected to the control electrode of the third transistor and the first capacitor connection part; or
   an orthographic projection of the first electrode of the fifth transistor on the substratum overlaps partially with an orthographic projection of the third capacitor connection part of the shift register at the previous stage on the substratum, and the first electrode of the fifth transistor is electrically connected to the third capacitor connection part of the shift register at the previous stage; or the orthographic projection of the third capacitor connection part on the substratum overlaps at least partially with an orthographic projection of the first electrode of the tenth transistor on the substratum, the orthographic projection of the third capacitor body part on the substratum overlaps at least partially with orthographic projections of the second electrode of the eighth transistor and the second electrode of the tenth transistor on the substratum, and the third capacitor body part is electrically connected to the second electrode of the eighth transistor and the second electrode of the tenth transistor, respectively.

19. The display substrate according to claim 13, wherein an orthographic projection of the first power supply line on the substratum overlaps at least partially with orthographic projections of the control electrode of the fifth transistor and the control electrode of the sixth transistor on the substratum; and an orthographic projection of the second power supply line on the substratum overlaps at least partially with an orthographic projection of the second plate of the second capacitor on the substratum.

20. A display device comprising the display substrate according to claim 11.

* * * * *